(12) United States Patent
Lien et al.

(10) Patent No.: US 6,781,857 B1
(45) Date of Patent: Aug. 24, 2004

(54) CONTENT ADDRESSABLE MEMORY (CAM) DEVICES THAT UTILIZE MULTI-PORT CAM CELLS AND CONTROL LOGIC TO SUPPORT MULTIPLE OVERLAPPING SEARCH CYCLES THAT ARE ASYNCHRONOUSLY TIMED RELATIVE TO EACH OTHER

(75) Inventors: Chuen-Der Lien, Los Altos Hills, CA (US); Chau-Chin Wu, Cupertino, CA (US); Mark Baumann, San Jose, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/306,799

(22) Filed: Nov. 27, 2002

Related U.S. Application Data

(63) Continuation-in-part of application No. 10/084,842, filed on Feb. 27, 2002, now Pat. No. 6,657,878.
(60) Provisional application No. 60/395,924, filed on Jul. 15, 2002.

(51) Int. Cl.[7] .......................... G11C 15/00; G11C 8/00
(52) U.S. Cl. ..................... 365/49; 365/189.07; 365/233
(58) Field of Search ............................ 365/49, 189.07, 365/233, 51

(56) References Cited

U.S. PATENT DOCUMENTS

| | | |
|---|---|---|
| 5,319,589 A | 6/1994 | Yamagata et al. |
| 5,319,590 A | 6/1994 | Montoye |
| 5,446,685 A | 8/1995 | Holst |
| 5,532,966 A | 7/1996 | Poteet et al. |
| 5,598,115 A | 1/1997 | Holst |
| 5,706,224 A | 1/1998 | Srinivasan et al. |
| 5,852,569 A | 12/1998 | Srinivasan et al. |
| 5,964,857 A | 10/1999 | Srinivasan et al. |
| 6,092,223 A | 7/2000 | Ahn |
| 6,101,116 A | 8/2000 | Lien et al. |
| 6,118,712 A | 9/2000 | Park et al. |
| 6,122,706 A | 9/2000 | Leong et al. |
| 6,128,207 A | 10/2000 | Lien et al. |
| 6,137,707 A | 10/2000 | Srinivasan et al. |
| 6,157,558 A | 12/2000 | Wong |
| 6,157,582 A | 12/2000 | Rezeanu |
| 6,199,140 B1 | 3/2001 | Srinivasan et al. |
| 6,219,285 B1 | 4/2001 | Murakuki et al. |
| 6,256,216 B1 | 7/2001 | Lien et al. |
| 6,262,907 B1 | 7/2001 | Lien et al. |
| 6,275,426 B1 | 8/2001 | Srinivasan et al. |
| 6,307,417 B1 | 10/2001 | Proebsting |
| 6,343,037 B1 | 1/2002 | Park et al. |
| 6,353,332 B1 | 3/2002 | Brelet |
| 6,362,990 B1 | 3/2002 | Gibson et al. |
| 6,370,052 B1 | 4/2002 | Hsu et al. |
| 6,418,042 B1 * | 7/2002 | Srinivasan et al. ........... 365/49 |
| 6,597,594 B2 * | 7/2003 | Waller ......................... 365/49 |
| 6,657,878 B2 | 12/2003 | Lien et al. |

OTHER PUBLICATIONS

U.S. application No. 10/004,456, filed Oct. 19, 2001.
U.S. application No. 09/617,155, filed Jul. 17, 2000.

* cited by examiner

*Primary Examiner*—Thong Q. Le
(74) *Attorney, Agent, or Firm*—Myers Bigel Sibley & Sajovec

(57) ABSTRACT

A CAM device includes an array of multi-compare port CAM cells therein. The CAM cells are configured to support concurrent search operations between multiple distinct search words and entries within the rows of the CAM array. These concurrent search operations may be performed in-sync with respective clock signals that are asynchronous relative to each other.

32 Claims, 22 Drawing Sheets

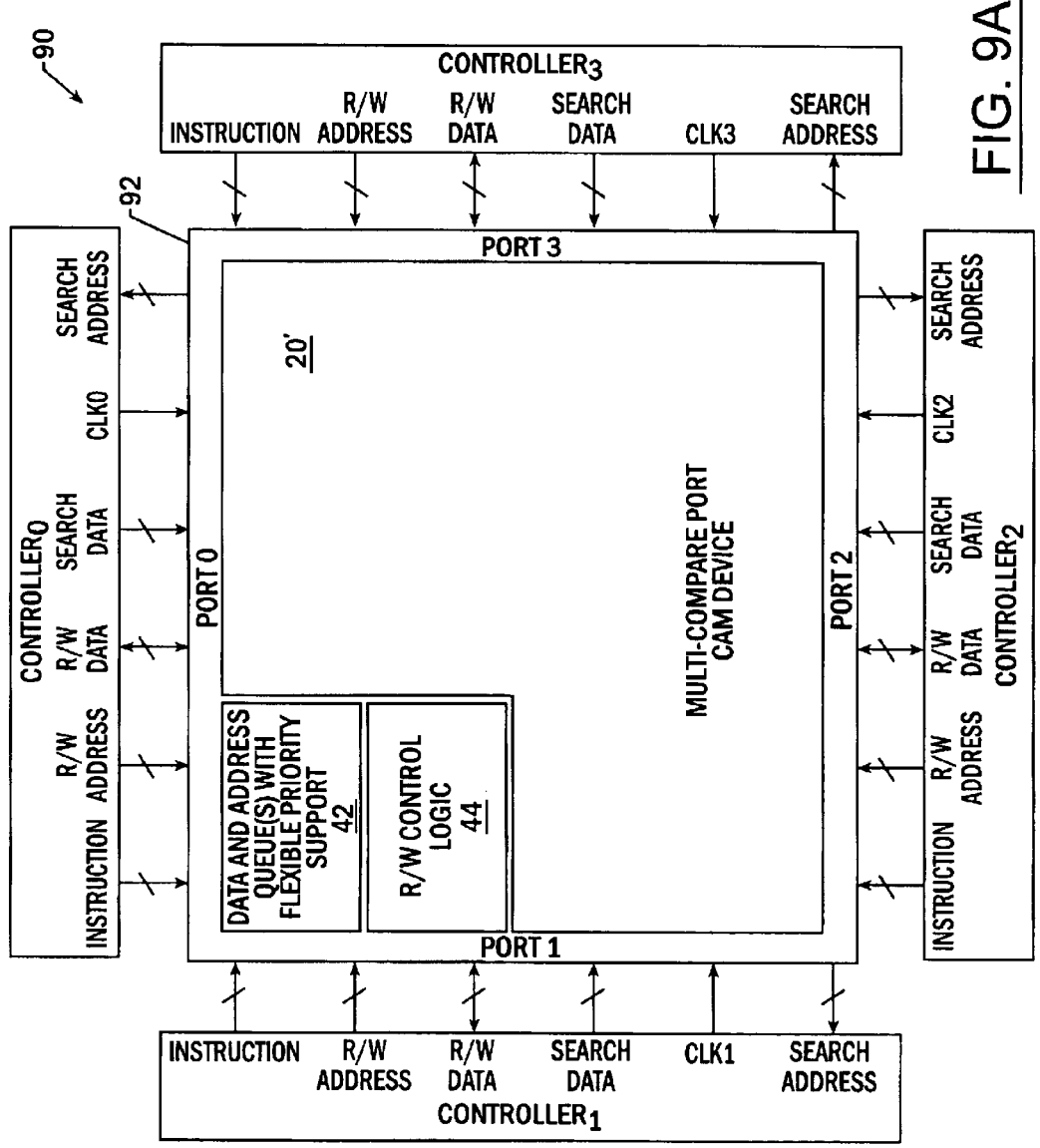

CONTENT ADDRESSABLE MEMORY (CAM) DEVICES THAT UTILIZE MULTI-PORT CAM CELLS AND CONTROL LOGIC TO SUPPORT MULTIPLE OVERLAPPING SEARCH CYCLES THAT ARE ASYNCHRONOUSLY TIMED RELATIVE TO EACH OTHER

CROSS-REFERENCE TO RELATED APPLICATIONS

This application, which claims priority to U.S. Provisional Application Ser. No. 60/395,924, filed Jul. 15, 2002, is a continuation-in-part (CIP) of U.S. application Ser. No. 10/084,842, filed Feb. 27, 2002 now U.S. Pat. No. 6,657,878, the disclosure of which is hereby incorporated herein by reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. A global search operation is frequently referred to as a "look-up" operation and a local search operation is frequently referred to as a cell-based "compare" operation.

Upon completion of the search operation, the identified location(s) containing the equivalent data is typically encoded to provide an address (e.g., CAM array block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207, 6,266,263 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that a compare operation performed on the actively masked ternary CAM cell during a global search operation will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a search operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}, . . . , {1XXX}, {XXXX}.

Operations to perform a conventional compare operation will now be described more fully with respect to FIG. 1A. In particular, FIG. 1A illustrates a conventional ten transistor (10T) CAM cell 10. The CAM cell 10 includes an SRAM data cell and a compare circuit. The SRAM data cell includes first and second access transistors N1 and N2 and first and second inverters that are electrically coupled in antiparallel. The true and complementary inputs of the SRAM data cell are electrically coupled to a true bit line BIT and a complementary bit line BITB, respectively. The true and complementary outputs of the SRAM data cell are illustrated as nodes Q and QB, respectively. The compare circuit includes transistors N3–N6, with the gate of transistor N6 operating as a true data input of the compare circuit and the gate of transistor N4 operating as a complementary data input of the compare circuit. As illustrated, the true data input of the compare circuit is electrically connected to the true data line DATA and the complementary data input of the compare circuit is electrically connected to the complementary data line DATAB. As illustrated by the dotted lines, the true bit line BIT and the complementary data line DATAB may be electrically connected together as a first bit line and the complementary bit line BITB and the true data line DATA may be electrically connected together as a second bit line. The first and second bit lines may be treated as a pair of differential bit/data lines that support rail-to-rail (e.g., Vdd-to-Vss) signals.

The compare circuit is also electrically connected to a pair of signal lines. This pair of signal lines includes a match line (ML) and a pseudo-ground line (PGND) (or ground line (Vss)). The pseudo-ground line PGND may be referred to as a "low" match line (LM). The operation of a CAM cell that is responsive to a match line (ML) and low match line (LM) is more fully described in U.S. Pat. No. 6,262,907 to Lien et al., entitled "Ternary CAM Cell," assigned to the present assignee, the disclosure of which is hereby incorporated herein by reference.

The match line ML and pseudo-ground line PGND are precharged high prior to a compare operation and then the pseudoground line PGND is pulled low at a commencement of the search operation. During the search operation, the potential of the match line can be monitored to determine whether or not the CAM cell 10 is associated with a matching entry within a CAM array. For example, if the SRAM data cell within the CAM cell 10 is storing a logic 1 value (Q=1 and QB=0) and the illustrated pair of data lines is driven with a matching logic 1 value (i.e., DATA=1 and DATAB=0), then transistors N3 and N6 within the compare circuit will be turned on and transistors N4 and N5 within the compare circuit will remain off. Under these conditions, the series electrical connection provided by transistors N3 and N4 and the series electrical connection provided by transistors N5 and N6 will both remain nonconductive. Accordingly, the CAM cell 10 will not operate to electrically connect (i.e., "short") the match line and pseudo-ground line PGND together and, therefore, will not operate to pull-down the match line from its precharged high level. In contrast, if the SRAM cell within the CAM cell 10 is storing a logic 0 value (Q=1 and QB=0) and the illustrated pair of data lines is driven with an logic 1 value (i.e., DATA=1 and DATAB=0), then transistors N5 and N6 within the compare circuit will be turned on and transistors N3 and N4 within the compare circuit will remain off. Under these conditions, the series electrical connection provided by transistors N5 and N6 will become conductive and the match line will be pulled-down from its precharged high level.

Referring now to FIG. 2, a conventional nine transistor (9T) CAM cell 12 is illustrated. This CAM cell 12 includes an SRAM data cell and a compare circuit. The compare circuit includes three transistors N7–N9. When the SRAM data cell is storing a logic 1 value (i.e., Q=1 and QB=0), and the pair of differential data lines are driven with a logic 1 value (i.e., DATA=1 and DATAB=0), transistors N7 and N8 will remain off and node N will remain low at its precharged low level. Under these conditions, transistor N9 will remain nonconductive and the CAM cell 12 will not operate to pull the match line low from its precharged high level. In contrast, if the SRAM data cell is storing a logic 0 value (i.e., Q=0 and QB=1), and the pair of differential data lines are driven with a logic 1 value (i.e., DATA=1 and DATAB=0), transistor N7 will remain off, but transistor N8 will turn on and drive node N high from its precharged low level. Under these conditions, transistor N9 will turn on and the CAM cell 12 will pull the match line low from its precharged high level, thereby indicating a "miss" condition (i.e., a mismatch between the data stored in the SRAM data cell and the data bit applied to the pair of data lines).

The vertical CAM cell 14 of FIG. 3 includes an SRAM data cell, which is identical to the SRAM data cell of FIG. 1, and a SRAM mask cell. The SRAM mask cell includes access transistors N11 and N12 and a pair of inverters that are electrically connected in antiparallel. The differential outputs of the SRAM mask cell are illustrated as nodes M and MB. The gates of access transistors N11 and N12 are electrically connected to a respective mask line, which operates as a "word" line during operations to write data to and read data from the SRAM mask cell. By convention, the CAM cell 14 of FIG. 3 has three states: 1, 0 and X (don't care). The X state is achieved by setting the true output node M of the SRAM mask cell to a logic 0 value. When the true output node M of the SRAM mask cell is set to a logic 0 value, transistor N10 within the compare circuit will remain off and preclude the match line and pseudo-ground line PGND from being connected together during a search operation. Accordingly, setting the true output node M of the SRAM mask cell to a logic 0 value operates to actively mask the CAM cell 14 during a search operation and thereby prevents the CAM cell 14 from indicating a cell miss condition by pulling down the match line from its precharged high level. However, when the true output node M of the SRAM mask cell is set to a logic 1 value, the CAM cell 14 is not actively masked and the compare circuit operates in a similar manner to the compare circuit illustrated by FIG. 1.

The vertical CAM cell 16 illustrated by FIG. 4 is similar to the CAM cell 12 of FIG. 2, however, an additional SRAM mask cell is provided and the compare circuit is modified to include an additional transistor N13. The SRAM mask cell of FIG. 4 is identical to the SRAM mask cell of FIG. 3. As will be understood by those skilled in the art, setting the true output M of the SRAM mask cell to a logic 1 value will cause the transistor N13 within the compare circuit to become conductive. When the transistor N13 becomes conductive, the mask associated with the CAM cell 16 is inactive and the compare circuit of FIG. 4 operates identically to the compare circuit of FIG. 2.

Referring now to FIG. 1B, a block diagram of a partially full CAM array 18 undergoing a search operation is provided. Using conventional techniques, the match lines associated with invalid entries in the CAM array 18 may be disabled. The CAM array 18 of FIG. 1B may utilize one or more of the CAM cells described above with respect to FIGS. 1A and 2–4. The CAM array 18 is illustrated as having a maximum depth of 14 rows, with each row supporting an entry having a width of 14 bits. To improve manufacturing yield, the CAM array 18 is also illustrated as including an active redundant column of CAM cells, shown as column R, which replaces a defective normal column, shown as column 7.

Conventional circuitry to enable replacement of a defective column with a redundant column is illustrated by FIGS. 1C–1E. In particular, FIG. 1C illustrates a data line control circuit 40a and a fuse-programmable circuit 50 that enables the data line control circuit 40a when the illustrated fuse is not blown (FB=0) and disables the data line control circuit 40a when the fuse is blown or cut (FB=1) in response to yield testing. The elements of FIG. 1C are typically used to drive a main column of a CAM array. As illustrated by the global mask pass-through circuit 54a, an active low global mask signal (/GM) is provided to the data line control circuit 40a when FB=0. However, once the fuse is blown (and a reset pulse RESET is received), the pass-through circuit 54a operates to clamp the global mask input of the data line control circuit 40a at a logic 0 level, thereby masking the outputs DATA and DATAB in accordance with the illustrated truth table. FIG. 1D illustrates a data line control circuit 40b and a fuse-programmable circuit 50 that disables the data line control circuit 40b when the illustrated fuse is not blown (FB=0), which is the default condition upon manufacture, and enables the data line control circuit 40b when the fuse is blown or cut (FB=1). The elements of FIG. 1D are typically used to drive a redundant column of a CAM array. As illustrated by the global mask pass-through circuit 54b, an active low global mask signal (/GM) is provided to the data line control circuit 40b when FB=1. However, if the fuse is not blown, the pass-through circuit 54b operates to clamp the global mask input of the data line control circuit 40b at a logic 0 level, thereby masking the outputs DATA and DATAB in accordance with the illustrated truth table. Referring now to FIG. 1E, a conventional bit line control circuit 42 is illustrated. The conventional bit line control circuit 42 typically drives respective pairs of differential bit lines BIT and BITB at levels consistent with a conventional read operation (i.e., BIT=BITB=1) by clamping a write control input of the bit line control circuit 42 at a logic 0 level, in response to a blown fuse (i.e., FB=1).

During the performance of a search operation on the CAM array 18 of FIG. 1B, an applied search word having a width of 14 bits is driven onto 14 pairs of complementary comparand data lines (e.g., DATA/DATAB) that span respective active columns of the CAM array 18. In particular, the search word is applied to columns 1–6, 8–14 and R of the CAM array 18, while the defective column 7, which has been disabled by a bit line control circuit (not shown), receives a mask value (i.e., $DATA_7=DATAB_7=0$). Based on the illustrated masking of column 7, only row 7 of the CAM array 18 will generate a match condition in response to the search operation.

As will be understood by those skilled in the art, a defective column of a CAM array can be masked during a search operation by pulling and holding both data lines low (i.e., DATA=0 and DATAB=0). Pulling and holding both data lines low operates to disable the compare circuit associated with each CAM cell within the defective column. Thus, in the illustrated example, defective column 7 of the CAM array 18 is masked during each search operation. Because column 7 is masked during each search operation, it has not been necessary for control circuitry associated with the CAM array 18 to intentionally write the data values of the CAM cells in the defective column, because none of the data values within a defective column will be compared with any valid bit of an applied search word. Typically, the data values of the CAM cells in a defective column achieve random or arbitrary states (shown as ?) when the CAM array 18 is powered-up for a first time and one or more of these states may switch every time the CAM array 18 undergoes a power reset event.

A CAM array may also be provided with CAM cells having multiple compare ports that facilitate increased search rates. For example, FIGS. 4–6 of U.S. Pat. No. 6,137,707 illustrates a CAM cell having multiple compare circuits therein that receive distinct comparands during overlapping search cycles. As illustrated by FIG. 4 of the '707 patent, these comparands (DATA1–DATAn) are used as search words during overlapping search cycles that are synchronized to a single clock signal (CLK).

Notwithstanding the use of redundant columns to improve yield in manufactured CAM devices or the use of CAM cells that perform overlapping search operations, there continues to be a need for CAM devices having higher yield, increased reliability and higher search flexibility when used in an intended application.

SUMMARY OF THE INVENTION

Integrated circuit memory devices according to embodiments of the present invention include a content addressable memory (CAM) device having an array of multi-compare port CAM cells therein. These CAM cells are configured to support concurrent search operations between multiple distinct search words and entries within the rows of the CAM array. These concurrent search operations may be performed in-sync with respective clock signals that are asynchronous relative to each other. In particular, the CAM device may include a CAM array that is arranged as a plurality of rows and a plurality of columns of multi-compare port CAM cells. The CAM array is configured to enable comparison between at least first and second search words (or segments thereof) that are applied concurrently to the same multi-compare port CAM cells and data entries stored in the plurality of rows. A control circuit is also provided. This control circuit is configured to provide the CAM array with search control signals that enable the plurality of rows to be searched with the first and second search words during overlapping search cycles. These search cycles are synchronized to separate clock signals, which are asynchronous relative to each other. These clock signals may be derived from clock signals generated external to the CAM device. Each search cycle may also span a plurality of periods of a respective clock signal.

According to preferred aspects of these embodiments, the plurality of rows of multi-compare port CAM cells include first and second rows of CAM cells that share at least first and second independently controllable pseudo-ground lines. The overlapping search cycles may also include a first search cycle that is commenced in-sync with a high-to-low transition of the first pseudo-ground line and a second search cycle that is commenced in-sync with a high-to-low transition of the second pseudo-ground line.

CAM devices according to additional embodiments of the present invention include a CAM array having at least first and second rows of multi-compare port CAM cells therein that share at least first and second independently controllable pseudo-ground lines. A control circuit is also provided. This control circuit is configured to provide the CAM array with search control signals that enable the multi-compare port CAM cells in the first and second rows to be concurrently searched with different search words during first and second overlapping search cycles that are in-sync with first and second clock signals, which are asynchronous relative to each other.

The CAM device also includes a first PMOS pull-up transistor having a first current carrying terminal that is electrically coupled to a first match line associated with the first row of multi-compare port CAM cells. This first PMOS pull-up transistor has a gate terminal that is responsive to a first evaluation signal. A first NMOS pull-up transistor is also provided. The first NMOS pull-up transistor has a first current carrying terminal that is electrically coupled to the first pseudo-ground line. The first NMOS pull-up transistor has a gate terminal that is responsive to a complementary version of the first evaluation signal. A second PMOS pull-up transistor is also provided. The second PMOS pull-up transistor has a first current carrying terminal that is electrically coupled to a first match line associated with the second row of multi-compare port CAM cells and a gate terminal that is responsive to the first evaluation signal.

A CAM array according to a further embodiment of the present invention includes a first lateral multi-compare port CAM cell therein. This lateral CAM cell includes first and second RAM cells and a first compare circuit that is disposed between the first and second RAM cells. The first compare circuit is electrically coupled to: a first pair of differential data lines, first and second outputs of the first and second RAM cells, a first match line and a first pseudo-ground line. The first lateral CAM cell also includes a second compare circuit that disposed between the first and second RAM cells. The second compare circuit is electrically coupled to: a second pair of differential data lines, the first and second outputs of the first and second RAM cells, a second match line and a second pseudo-round line.

An integrated circuit system according to another embodiment of the present invention includes at least a first data processing unit that generates a first clock signal and a second data processing unit that generates a second clock signal, which is asynchronous relative to the first clock signal. A multi-port CAM chip is also provided. The CAM chip includes a first data port that is configured to receive first search words from the first data processing unit, in-sync with the first clock signal. The CAM chip also includes a second data port that is configured to receive second search words from the second data processing unit, in-sync with the second clock signal. The CAM chip also includes a multi-compare port CAM array that is configured to support overlapping first and second search cycles that are synchronized with the first and second clock signals, respectively. According to a preferred aspect of this embodiment, the CAM chip further includes at least one address queue that is configured to retain read addresses, write addresses and write data received from the first and second data processing units. The at least one address queue may have flexible priority support that enables entries therein to be processed out-of-turn during write and/or read operations.

Content addressable memory (CAM) devices according to further embodiments of the present invention provide improved reliability by inhibiting disabled CAM cells within defective columns from contributing to either sustained or intermittent look-up errors when the CAM device is operated in an intended application. The improved reliability is preferably achieved in volatile CAM devices by configuring (e.g., programming) each column driver that is associated with a CAM array having a defective column therein to preserve intentionally written data and/or mask values of the disabled CAM cells across repeated power reset events that may occur at the chip or system level. Still further improvements in reliability can be achieved by configuring each column driver that is associated with a CAM array having an unused redundant column of CAM cells therein to preserve intentionally written data and/or mask values of the CAM cells in the unused redundant column across the power reset events. Preserving these intentionally written data and/or mask values in defective column CAM cells (and/or inactive redundant column CAM cells) operates to reduce the number of CAM cells that are likely to contribute to sustained or intermittent look-up (or other) errors that may occur after a CAM device is tested and shipped to a user.

In particular, CAM devices according to embodiments of the present invention comprise at least one CAM array and a column driver circuit that is electrically coupled to the CAM array by bit lines and/or data lines. The CAM array has a plurality of main columns of CAM cells and at least one redundant column of CAM cells therein. During initial testing, a first one of the main columns of CAM cells may be identified as a defective column and replaced by another column in the CAM array. In response to detecting the defective column during testing, the redundant column of CAM cells may be enabled and used as a replacement for one of the main columns. The column driver circuit, also referred to herein as a bit line driver circuit (or bit/data line driver circuit), is preferably programmed to enable the redundant column and disable the defective column. Once programmed, the column driver circuit may drive at least one disabled CAM cell in the defective column with a respective fixed data value. This operation is preferably performed whenever the at least one disabled CAM cell undergoes a write operation. After being programmed, the CAM device may again be tested to assess yield prior to shipping to the user.

The disabled CAM cell may be a CAM cell having a data RAM cell and a mask RAM cell therein. In this case, the column driver circuit is also preferably programmed to drive the mask RAM cell with a respective fixed mask value whenever the mask RAM cell undergoes a write operation. The data RAM cell and the mask RAM cell may be selected from a group consisting of SRAM cells, DRAM cells and nonvolatile RAM cells (e.g., EEPROM). According to a preferred aspect of this embodiment, the column driver circuit is programmed (e.g. fuse-programmed) to drive the bit lines associated with a defective column with the same fixed data value whenever any one of the disabled CAM cells in the defective column undergoes a write operation.

CAM devices according to further embodiments of the present invention preferably include a CAM array having a plurality of main columns of CAM cells and at least one redundant column of CAM cells therein. The main and redundant columns of CAM cells are preferably coupled to a bit line driver circuit. In response to yield testing, the bit line driver circuit is programmed to preserve previously written data values of column disabled CAM cells across a power reset event so that each column disabled CAM cell associated with a row containing a valid entry prior to a power reset event is rewritten again with a same data value it had prior to the power reset event. These rewriting operations are performed in sequence as rows within the CAM array are updated with new entries after the power reset event. The column disabled CAM cells include CAM cells located in inactive defective columns and/or unused redundant columns. The column disabled CAM cells are preferably volatile CAM cells that retain one of three states (1, 0, X) that can be evaluated during search operations. Such CAM cells may include a data RAM cell and a mask RAM cell. The CAM cell may be configured so that the mask RAM cell can be read along with the data RAM cell during a reading operation. The bit line driver circuit is also preferably programmed to preserve the mask values of the column disabled CAM cells across a power reset event.

Still further embodiments of the present invention include methods of operating content addressable memory (CAM) devices by writing a first data value and second data/mask value into a CAM cell comprising first and second RAM cells that share a respective word line and are separated by compare logic having true and complementary data inputs that are electrically coupled to a true data line D and a complementary data line DB, respectively. In preparation of a search operation, a match line and a pseudo-ground line associated with a row of CAM cells are precharged high. A potential of the true data line is then at least partially equilibrated with a potential of the complementary data line by transferring charge between the true and complementary data lines. The data lines are then driven rail-to-rail to represent a logic 1 or logic 0 value thereon as a bit of a comparand. An operation to compare a state of the CAM cell with the bit of the comparand is then performed, in response to pulling the precharged pseudo-ground line low. The step to equilibrate data line potentials preferably includes transferring charge from a more positively biased one of the true and complementary data lines to a less positively biased one of the true and complementary data lines for a duration sufficient to achieve a potential difference between the true and complementary data lines that is less than about 30% of a rail-to-rail voltage (i.e., less than about 0.3(Vdd−|Vss|)).

A content addressable memory (CAM) device according to another embodiment of the present invention includes a CAM array having a disabled CAM cell therein. The disabled CAM cell includes a first RAM cell and a second RAM cell that share a respective word line. First and second pairs of differential bit lines are also provided. The first pair of differential bit lines (e.g., B1, B1B) are electrically connected to the first RAM cell and the second pair of differential bit lines (e.g., B2, B2B) are electrically connected to the second RAM cell. A bit/data line control circuit is also provided. The bit/data line control circuit is fuse-programmed to clamp and hold a first one of the first pair of differential bit lines (e.g., B1/DB) and a first one of the second pair of differential bit lines (e.g., B2/D) at a first voltage level (e.g., Vss) when the CAM array undergoes reading, writing and search operations.

BRIEF DESCRIPTION OF THE DRAWINGS

FIG. 9A is a block diagram of an integrated circuit system having a plurality of controllers and a multi-port CAM chip according to an embodiment of the present invention.

DESCRIPTION OF PREFERRED EMBODIMENTS

Figure 1A:
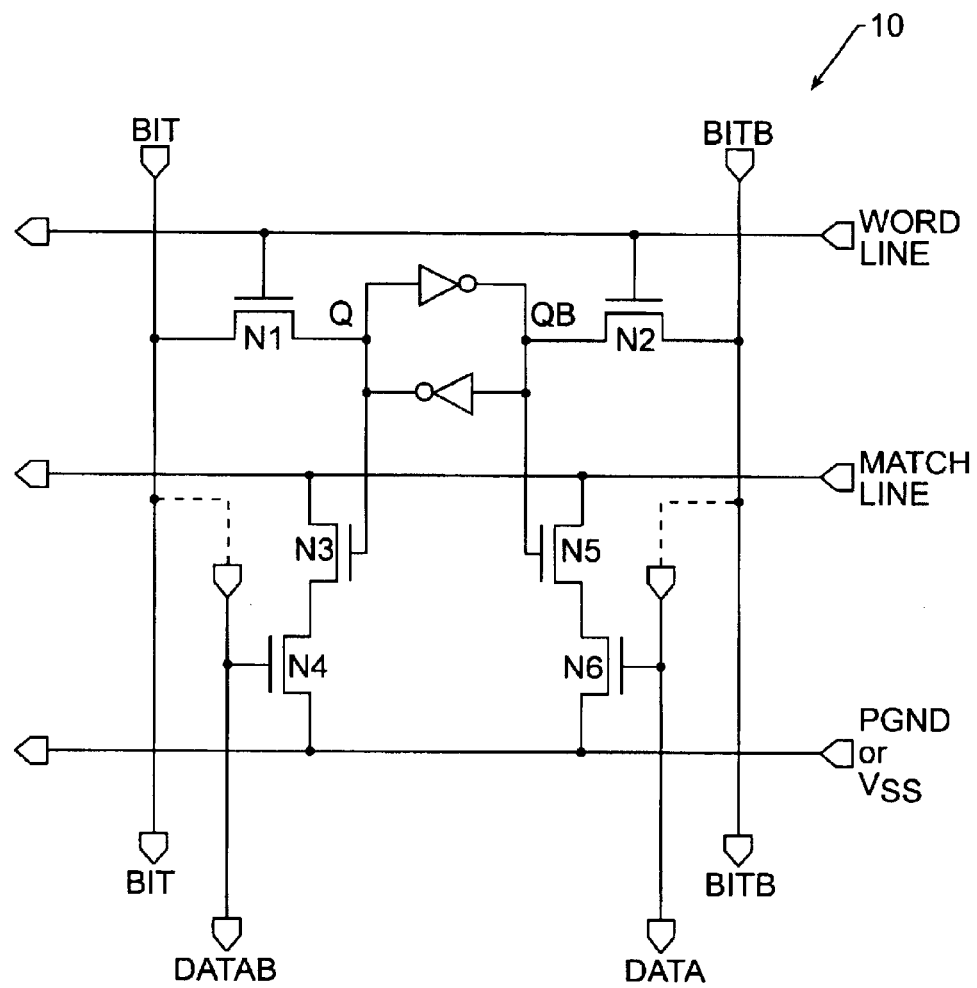
FIG. 1A is an electrical schematic of a conventional 10T CAM cell.
Figure 1B:
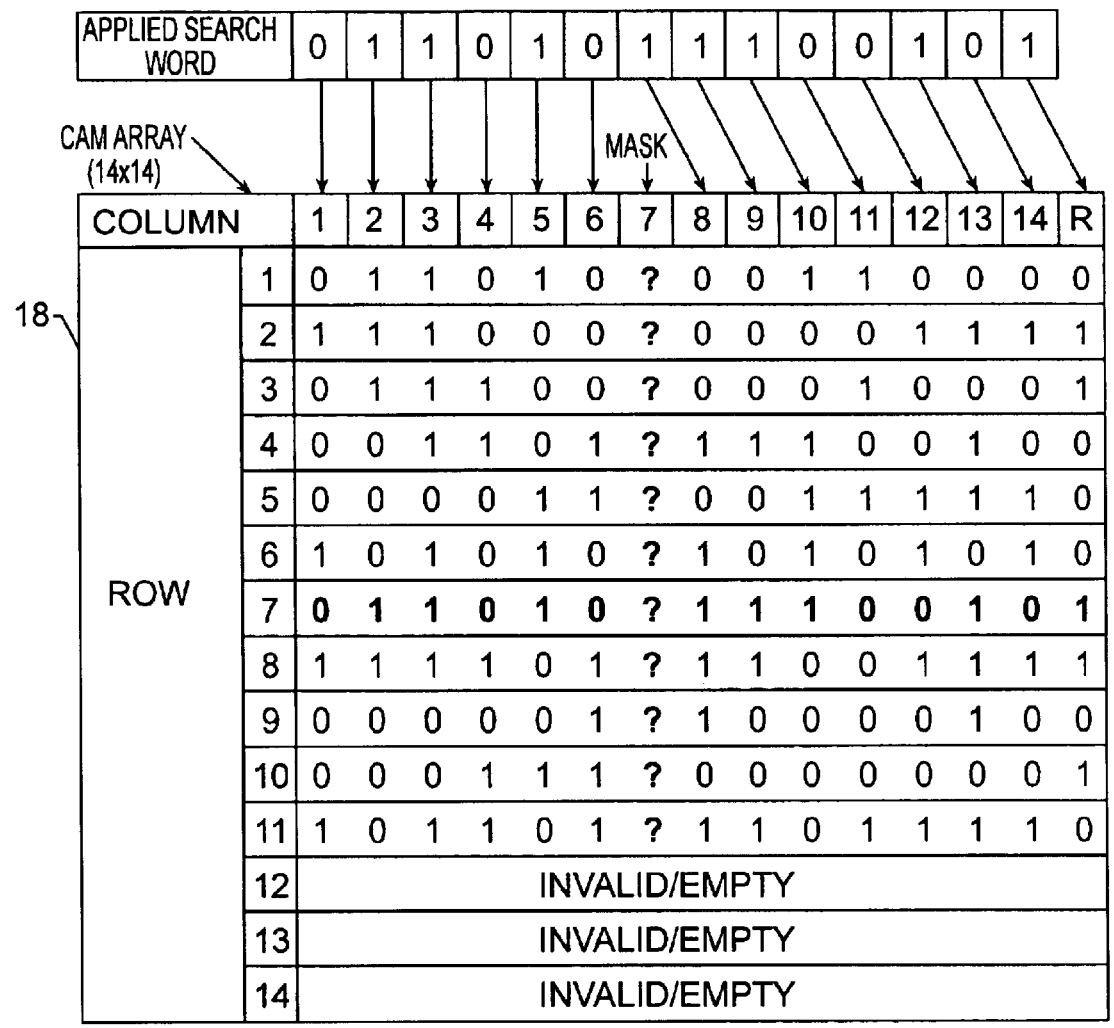
FIG. 1B is a block diagram of a partially full CAM array undergoing a search operation with an applied search word, according to the prior art.
Figure 1C:
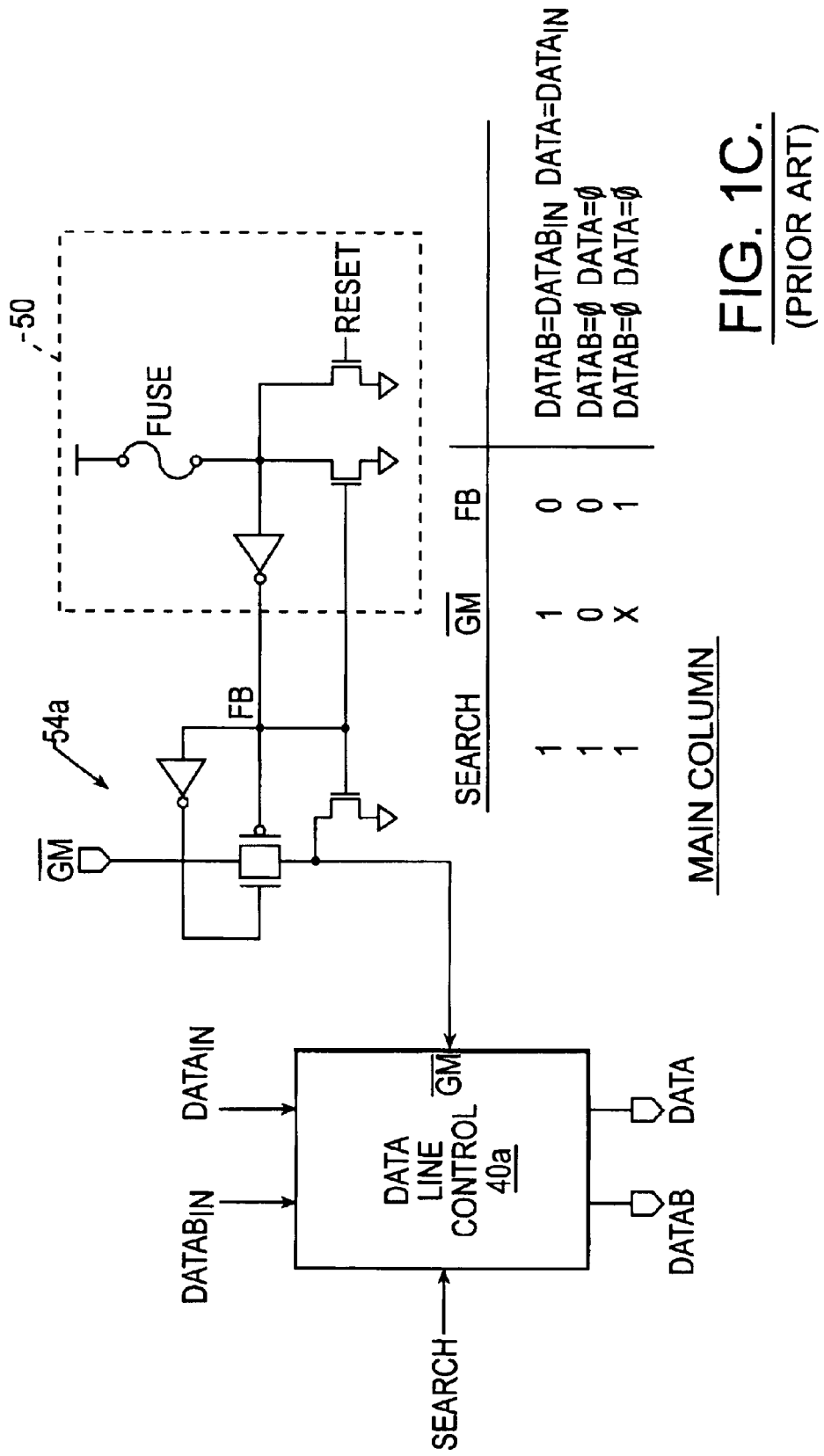
FIG. 1C illustrates a data line control circuit and a fuse-programmable circuit for a main column of a CAM array, according to the prior art.
Figure 1D:
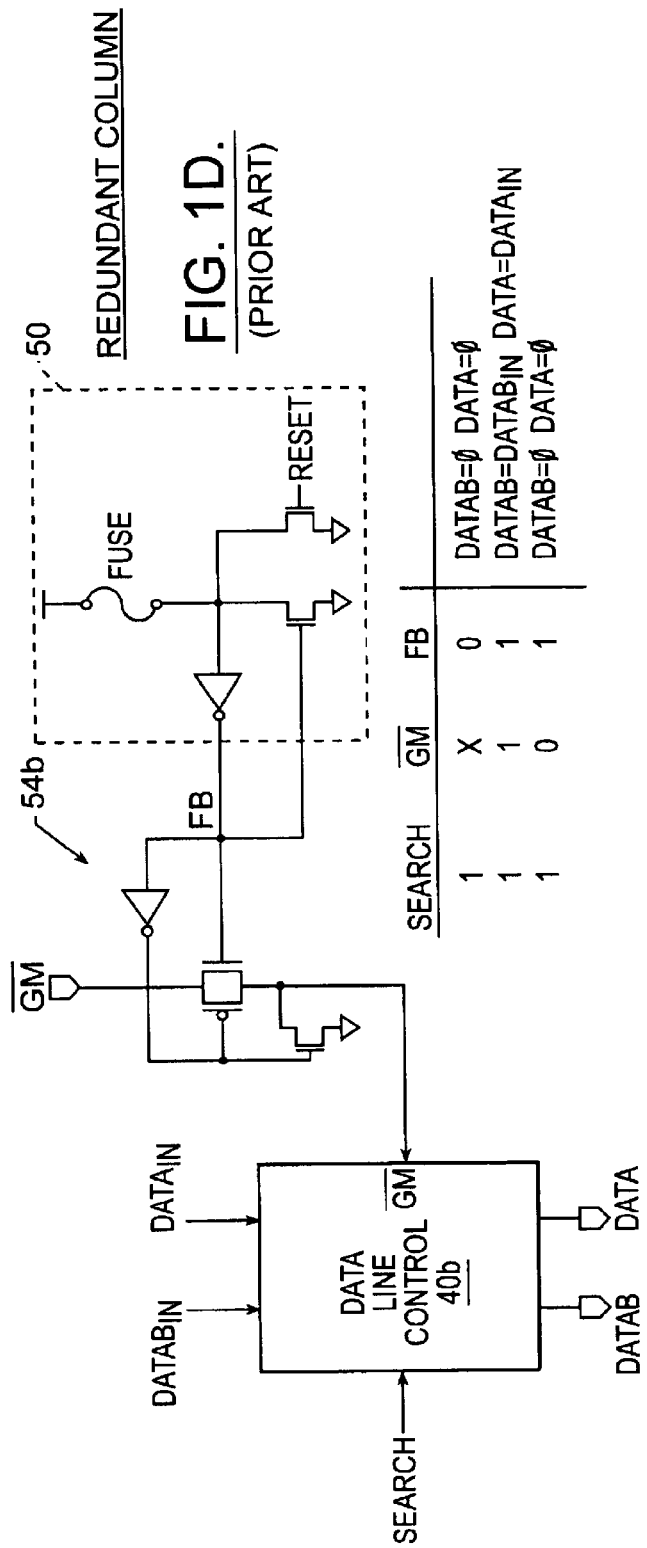
FIG. 1D illustrates a data line control circuit and a fuse-programmable circuit for a redundant column of a CAM array, according to the prior art.
Figure 1E:
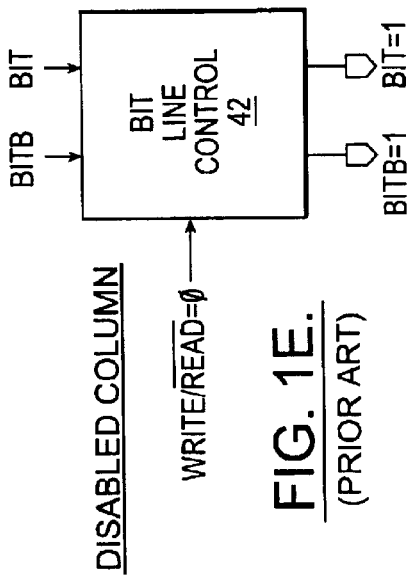
FIG. 1E illustrates a conventional bit line control circuit.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

As described above with respect to FIGS. 1A–1B and 2–4, improved yield may be achieved when manufacturing CAM devices by designing CAM arrays to include one or more redundant columns of CAM cells that can be enabled in response to detecting a defective column of CAM cells during manufacturer yield testing. Moreover, because a defective column of CAM cells is typically globally masked when a respective CAM array is searched, the data and/or mask values stored in CAM cells within a defective column typically achieve random or arbitrary values upon power up and these values may later change in response to changes in operating conditions (e.g., power reset events). Unfortunately, such changes in the data and/or mask values of CAM cells within a defective column may cause conventional CAM devices to exhibit relatively poor reliability when they are used in an intended application by a customer. This poor reliability may be present even if such CAM devices successfully pass comprehensive yield testing prior to shipping.

For example, if the CAM cell 10 of FIG. 1A resides within a defective column that has been replaced and the CAM cell 10 has a leaky transistor N4 within its compare circuit, then the "defective" CAM cell 10 may be properly masked during a manufacturer's yield test so long as the data value stored within the CAM cell 10 is a logic 0 value and the transistor N3 thereby remains off. Under these specific conditions, the CAM device may pass the manufacturer's yield test. However, if the data value within the defective CAM cell 10 changes to a logic 1 value, in response to a change in operating condition (e.g., power reset), transistor N3 will turn on and a sufficiently conductive path may be established through the series connection of transistor N3 and the leaky transistor N4. This conductive path may operate to pull-down the match line from its precharged high level to thereby indicate a miss condition. This miss condition may be erroneous if the CAM cell 10 is located in a row containing an entry that matches the applied search word. Such a miss condition is typically intermittent because it requires the defective CAM cell to retain a logic 1 data value and also be located in a row containing an entry that happens to match an applied search word. Because these two required conditions may occur infrequently, a manufacturer's yield test may not successfully spot the defect prior to shipping to a customer.

Figure 2:
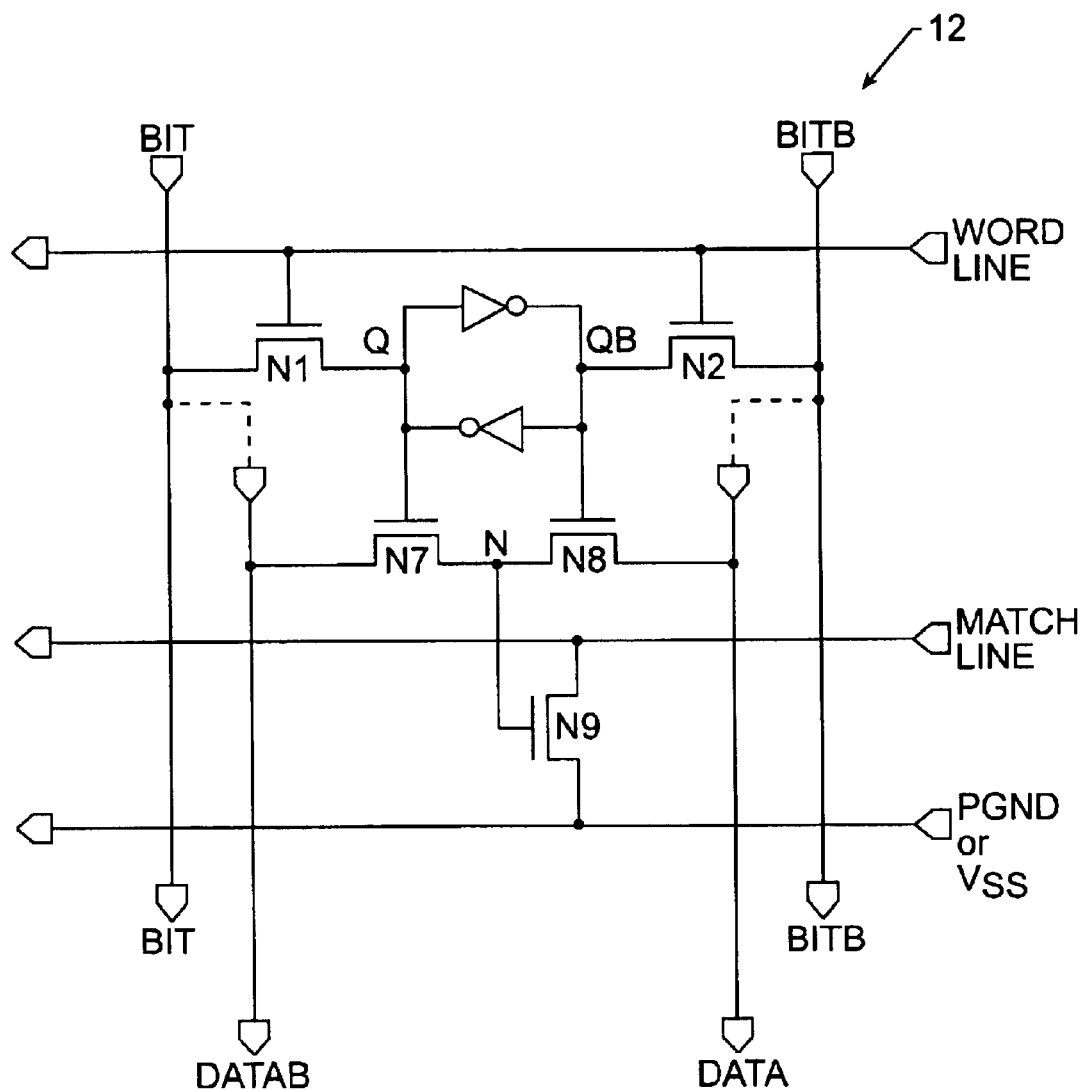
FIG. 2 is an electrical schematic of a conventional 9T CAM cell.

A similar intermittent error may also occur using the CAM cell 12 of FIG. 2. For example, if the transistor N7 in the CAM cell 12 of FIG. 2 is "open" and the stored data value is a logic 0 value (i.e., Q=0, QB=1), then transistor N8 will be conductive and the gate of transistor N9 will be held low at the potential of complementary bit line BITB (where BIT=BITB=0 when the defective column is masked during a search operation). Under these conditions, the CAM cell 12 will not erroneously indicate a miss condition. However, if the stored data value is a logic 1 value (i.e., Q=1, QB=0), then both transistors N7 and N8 will be held off and node N will be floating. In particular, node N may be floating high in response to capacitive coupling with the true output node Q of the SRAM data cell, which is set at a logic 1 value. This potentially high voltage at node N may cause transistor N9 to turn on and thereby pull the match line low and erroneously indicate a miss condition.

Figure 3:
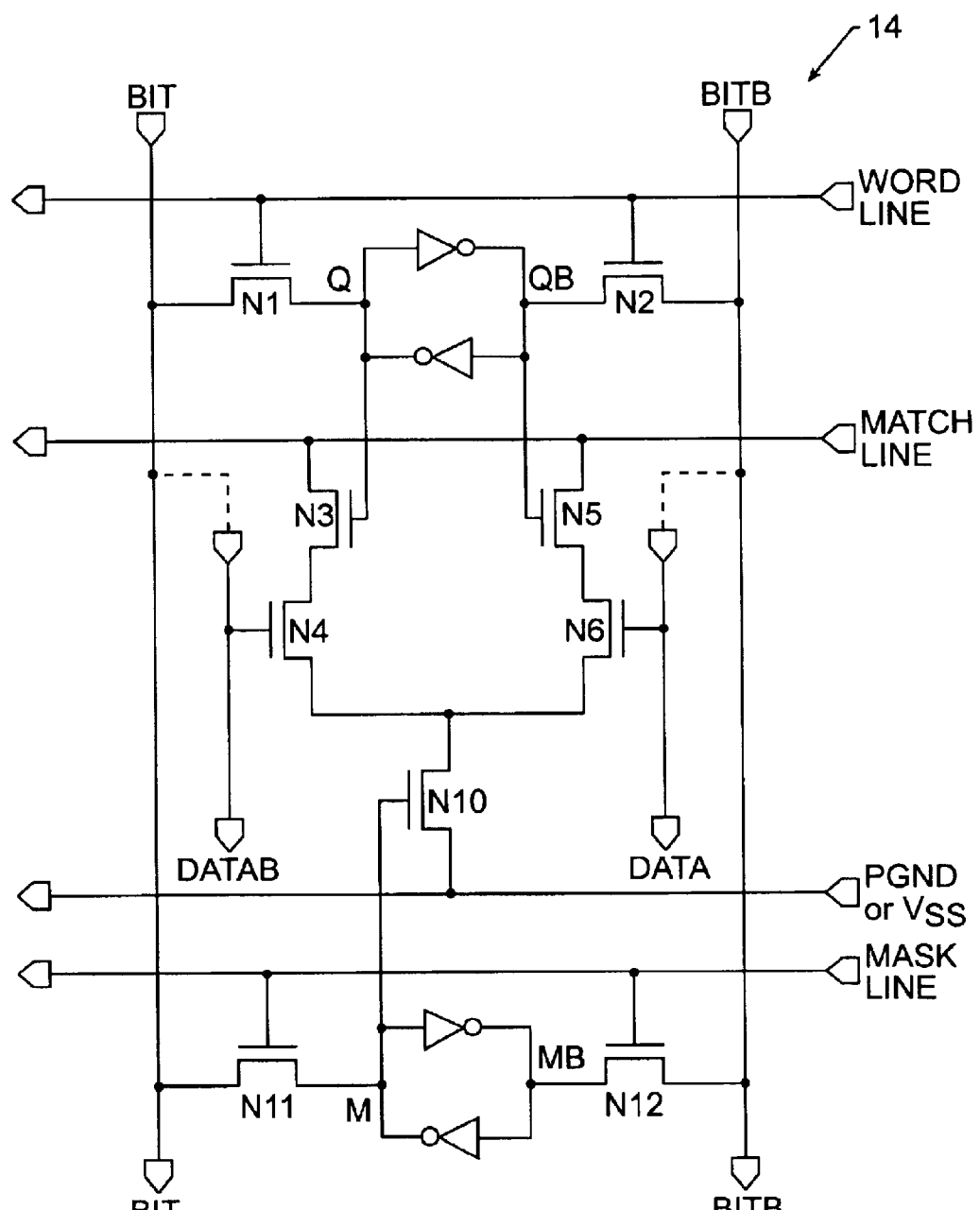
FIG. 3 is an electrical schematic of a conventional 17T CAM cell.
Figure 4:
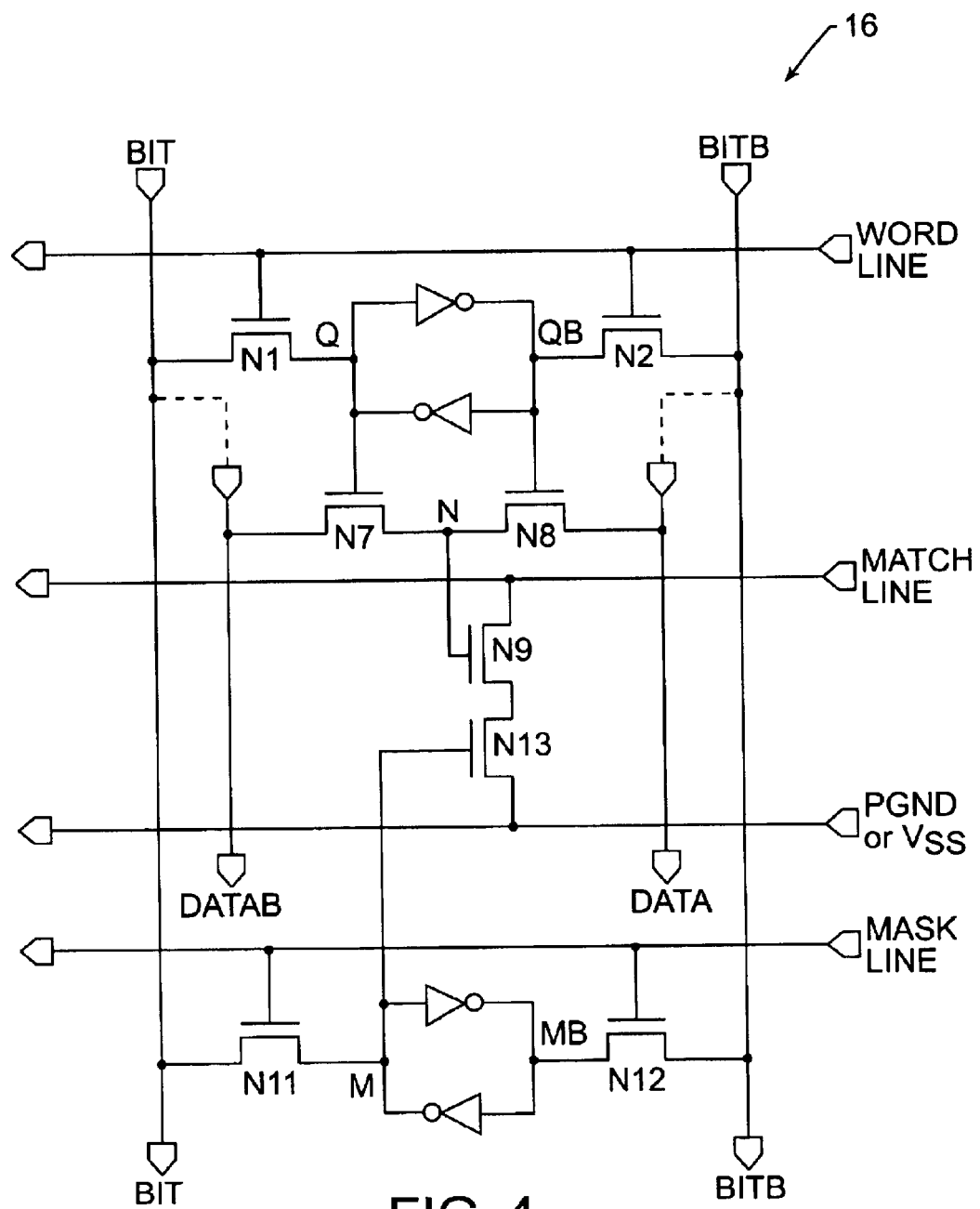
FIG. 4 is an electrical schematic of a conventional 16T CAM cell.

Similarly, if transistor N4 in the CAM cell 14 of FIG. 3 is leaky and the mask SRAM cell is storing a logic 1 value (i.e., M=1 and MB=0), then an erroneous miss condition may result if the data SRAM cell is storing a logic 1 value. Finally, if transistor N7 in the CAM cell 16 of FIG. 4 is open and the mask SRAM cell is storing a logic 1 value (i.e., M=1 and MB=0), then an erroneous miss condition may result if the data SRAM cell is storing a logic 1 value. Thus, in order for the CAM cell 16 of FIG. 4 to indicate an erroneous miss condition that can be detected during yield testing, three conditions should be met in the event transistor N7 is open: (i) the mask SRAM cell should be inactive (i.e., M=1, MB=0), (ii) the true output Q of the data SRAM cell should be set to a logic 1 value and (iii) the defective CAM cell 16 must reside within a row having an entry that matches the applied search word. Because the likelihood that conditions (i)–(iii) will all be present simultaneously is typically relatively small, a CAM cell 16 having the same or an analogous defect(s) to the one described may only contribute to relatively infrequent intermittent errors that may not be readily detectable during yield testing by a manufacturer.

Figure 5A:
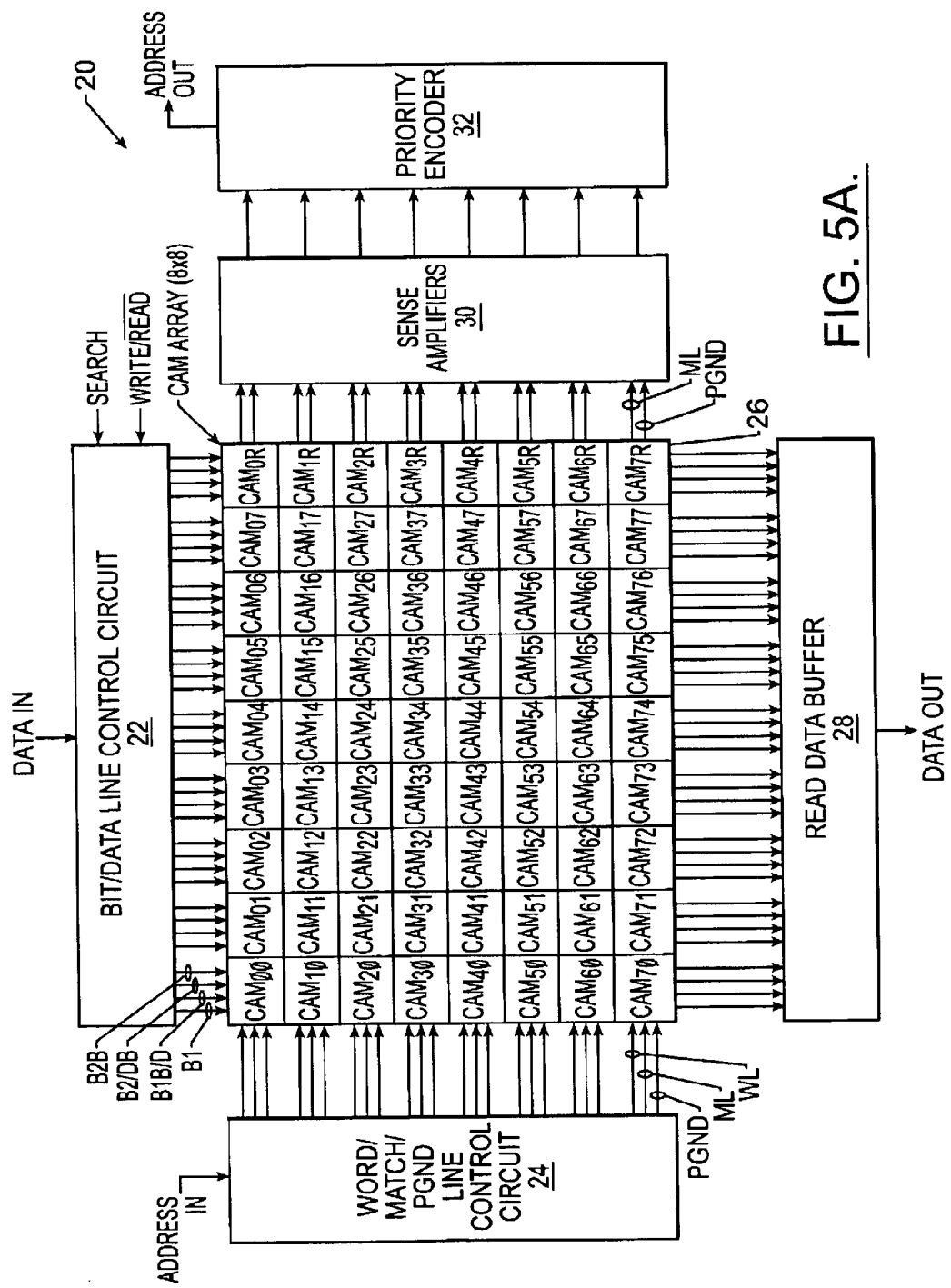
FIG. 5A is a block diagram of a 64-bit CAM device having column redundancy, according to an embodiment of the present invention.

To address the reliability limitations associated with conventional CAM devices, the CAM device 20 of FIG. 5A is provided with control circuitry that inhibits the occurrence of the reliability errors described above by intentionally writing each column disabled CAM cell in a row containing a valid entry with a respective data value (1 or 0) that is preserved every time the CAM device is "rebooted" or otherwise undergoes a power reset event. As illustrated by FIG. 5A, a preferred CAM device 20 includes a CAM array 26 having at least one redundant column, shown as column "R". For purposes of illustration only, the CAM array 26 of FIG. 5A has a capacity of 64 data bits. The CAM array 26 is arranged into eight (8) rows with eight (8) main columns (0–7) and one redundant column "R").

A row control circuit 24 is also provided. The row control circuit 24 is illustrated as a word/match/pgnd line control circuit. The row control circuit 24 may receive, among other things, an input address of a row to be accessed (written to or read from) in the CAM array 26. As illustrated, the row control circuit 24 may generate respective word line signals WL, match line signals ML and pseudo-ground line signals PGND to each row of CAM cells within the CAM array 26. In alternative embodiments, the row control circuit 24 may omit generation of the pseudo-ground line PGND signals in the event the CAM cells are connected directly to a fixed reference potential (e.g., Vss). Each row of the CAM array 26 may also be electrically coupled by respective match lines and pseudo-ground lines PGND to a bank of sense amplifiers 30. Using conventional match line signal detection techniques, the bank of sense amplifiers 30 may provide one or more active match signals to a row priority encoder 32. In response, the row priority encoder 32 may output an address of a highest priority matching entry within the CAM array 26. The row priority encoder may be of conventional design.

A read data buffer 28 is provided. The read data buffer 28 may be electrically coupled to each column of the CAM array 26 by two respective pairs of differential bit/data lines, for example. These differential lines are shown as B1, B1B, B2 and B2B. The read data buffer 28 is configured to latch in a row of data read from the CAM array 26 during a read operation and provide the read data to an output port (shown as DATA OUT). As described more fully hereinbelow, a read operation may be performed by initially driving (and then floating) all the pairs of differential bit lines high and then accessing a particular row of CAM cells by driving a respective word line WL high. The read data buffer 28 may be of conventional design.

A preferred column control circuit 22 is provided for driving all normal and redundant columns of CAM cells with write data during write operations and comparand data during search operations, which are also frequently referred to as "look-up" or compare operations. The comparand data may include all bits of a search word received at an input port (shown as DATA IN) or a combination of a plurality of bits of the search word and one or more global mask bits (i.e., D=DB=0). As illustrated, the column control circuit 22 may be electrically connected to each column of the CAM array 26 by two pairs of bit lines (shown as B1, B1B and B2, B2B). A complementary one of the first pair of bit lines (i.e., B1B) and a true one of the second pair of bit lines (i.e., B2) may also be used as a pair of differential data lines (i.e., D, DB). Thus, the four lines associated with each column of CAM cells may be identified from left to right as B1, B1B/D, B2/DB and B2B. This aspect of the CAM array is more fully illustrated by FIG. 5B.

The column control circuit 22, which is shown in the preferred embodiment of FIG. 5A as a bit/data line control circuit, preferably includes programmable circuitry (e.g., fuse-programmable circuitry) that can disable a defective main column of CAM cells within the CAM array 26 and enable a redundant column of CAM cells as a replacement for a main column of CAM cells. This programmable circuitry within the column control circuit may also have a default state whereby the redundant column is disabled unless yield testing detects a defective main column and a fuse is cut to recognize the redundant column as a replacement column. Memory devices that utilize control circuits to provide column redundancy are more fully described in U.S. application Ser. No. 09/617,155 to Bishop, entitled "Integrated Circuit Memory Devices Having Control Circuits Therein That Provide Column Redundancy Capability," now U.S. Pat. No. 6,373,757, assigned to the present assignee, the disclosure of which is hereby incorporated herein by reference.

As described more fully hereinbelow with respect to FIGS. 7A–7B, a CAM array having the preferred fuse-programmable circuitry may include a column of disabled CAM cells, with each disabled CAM cell including a first RAM cell and a second RAM cell that share a respective word line. First and second pairs of differential bit lines are also provided. The first pair of differential bit lines are electrically connected to inputs of each first RAM cell in a respective column and the second pair of differential bit lines are electrically connected to inputs of each second RAM cell in a respective column. The fuse-programmable circuitry within the column control circuit also preferably operates to (i) clamp a first one of the first pair of differential bit lines and a first one of the second pair of differential bit lines at a first voltage level (e.g., Vss) and to (ii) clamp a second one of the first pair of differential bit lines and a second one of the second pair of differential bit lines at a second voltage level (e.g., Vdd), whenever the CAM array undergoes reading, writing or search operations.

Figure 5B:
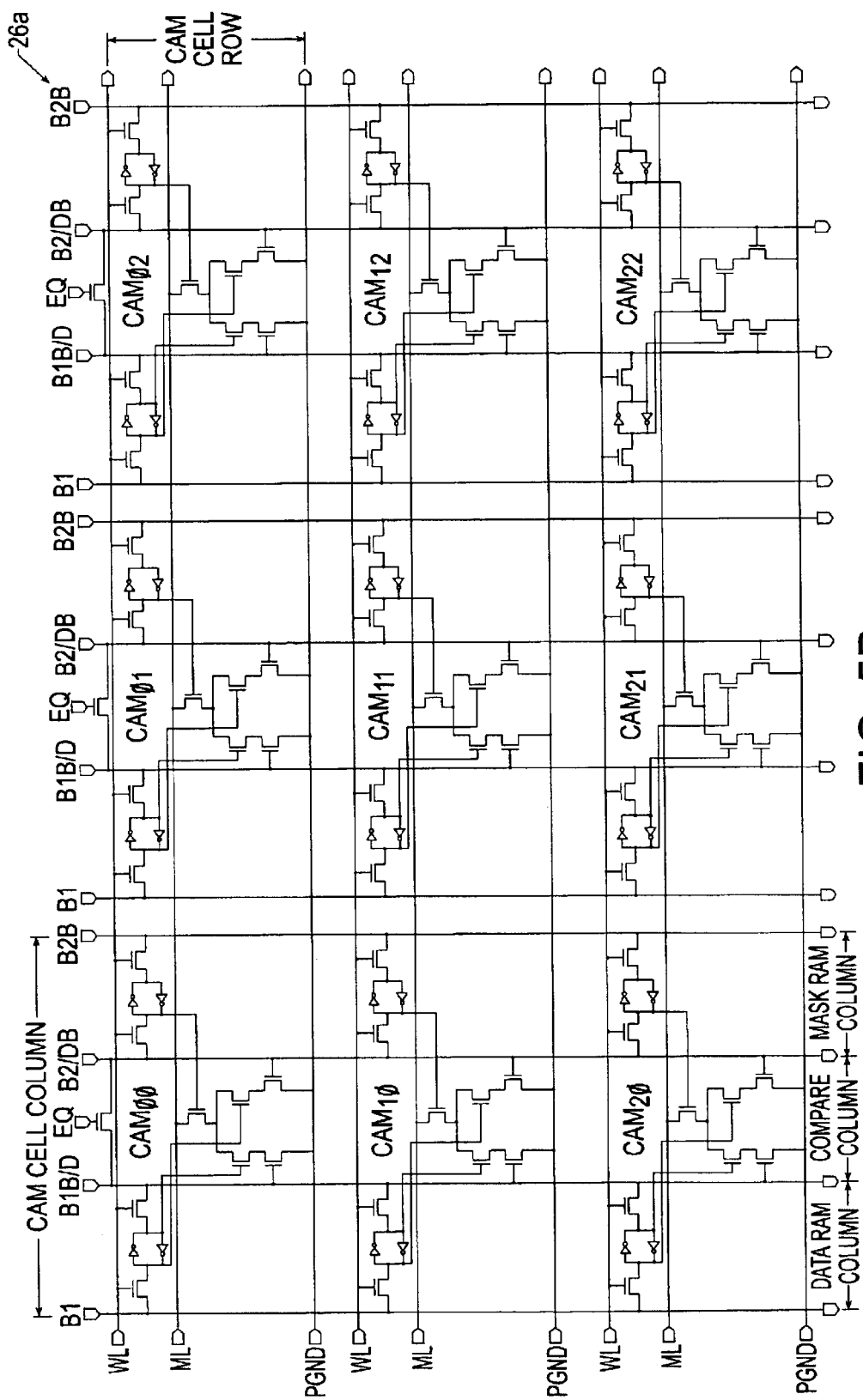
FIG. 5B is a detailed electrical schematic of an array of CAM cells that may be used in the CAM device of FIG. 5A.

Operation of the CAM device 20 of FIG. 5A will now be described more fully with respect to the 3×3 CAM array section 26a of FIG. 5B. As illustrated, the CAM array section 26a of FIG. 5B maps to rows 0–2 at the top left corner of the CAM array 26 of FIG. 5A. The CAM array section 26a of FIG. 5B illustrates a preferred "lateral" arrangement of each CAM cell. This lateral arrangement improves the width/depth ratio of the CAM array 26 by increasing the width and shortening the height of CAM cells in the array 26. This lateral arrangement also enables the bit/data lines to be shorter in length. Each CAM cell column in the array section 26a of FIG. 5B includes a data RAM column, a compare circuit column and a mask RAM column located side-by-side. Each data RAM cell and mask RAM cell within a respective CAM cell share a common word line, which means the data RAM cell and mask RAM cell may be written to and read from simultaneously. Based on the preferred lateral arrangement, a CAM array 26 having a logic width of 72 and a logical depth of 512 will include 144 main columns of RAM cells plus 72 columns of compare circuits that have a depth of 512. Thus, a preferred CAM array may be arranged as 216 (144+72) columns that each have a depth of 512, for a width/depth ratio of (216/512)= 0.42. In contrast, a conventional CAM array comprising the CAM cells of FIG. 3 and having a logical width of 72 and a logical depth of 512, will include 1024 rows of RAM cells plus 512 rows of compare circuits, for a width/depth ratio of 72/1536=0.05.

Data is written to or read from a data RAM cell using the leftmost pair of differential bit lines (B1, B1B) associated with a respective CAM cell column. Data is also written to or read from a mask RAM cell using the rightmost pair of differential bit lines (B2, B2B) associated with a respective CAM cell column. During a read operation, the leftmost pair or differential bit lines (B1, B1B) and the rightmost pair of differential bit lines (B2, B2B) are typically driven high to logic 1 values and then the outputs of the column control circuit 22 are disposed in high impedance states. A word line WL associated with a row being addressed is then driven high to turn on the input access transistors associated with each data RAM cell and mask RAM cell in the respective row. The bit lines can then be monitored (i.e., "read") to determine the resulting data and mask values on the bit lines (B1, B1 B, B2 and B2B). However, because the read data buffer 28 is typically configured to ignore one or more disabled columns within the CAM array during a read operation (because the data in a disabled column is irrelevant from a read standpoint), these bit line biasing operations need not be performed in the same manner on the bit lines associated with the disabled column(s).

According to an additional preferred aspect of the column control circuit 22 and the row control circuit 24 of FIG. 5A, each operation to write a new entry into a respective row within the CAM array 26 includes writing a data/mask value into each column disabled CAM cell within the respective row. These data/mask values are preferably fixed so that after a CAM array has been partially or completely filled, all column disabled CAM cells that are located in rows having valid entries retain the same data/mask values. It is also preferred that after each power reset event (e.g., reboot) or reloading of the CAM array with one or more new entries, all column disabled CAM cells in rows having valid entries be restored with the same data/mask value so that search operations may be reliably performed (and performed under the same data/mask values as those present in the disabled cells during initial yield testing by the manufacturer). Restoring the same data/mask values may require rewriting one or more of the column disabled CAM cells. Loading each column disabled CAM cell with a same fixed data/mask value may be most readily achieved by fuse-programming one or more pairs of bit line drivers (e.g., CMOS drivers) within the column control circuit 22. In particular, the bit line drivers associated with a defective column (or unused redundant column) may be configured to drive the two pairs of bit lines to the following fixed states during write operations: B1=0, B1B=1, B2=0, B2B=1 (when an input signal WRITE to the column control circuit 22 is active). Driving the two pairs of bit lines to the illustrated fixed states may also be performed whenever the CAM array 26 is undergoing a search operation (and B1B and B2 operate as a pair of data lines for comparand data) and whenever the CAM array 26 is undergoing a read operation.

Alternatively, the column control circuit 22 and row control circuit 24 may be configured so that each column disabled CAM cell in a row containing a valid entry retain or be reloaded with its respective data/mask value whenever its respective row is reloaded with a valid entry. Thus, each column disabled CAM cell in a physically even row may receive and retain one data/mask value combination (e.g., DATA←1, MASKS←0) and each column disabled CAM cell in a physically odd row may receive and retain another data/mask value combination (e.g., DATA←0, MASK←0). This configuration may require a greater degree of programming circuitry relative to the embodiment that drives all column disabled CAM cells with a same fixed data/mask value.

A number of examples will now be provided. As a first example, assume the CAM array 26 of FIG. 5A includes the CAM cells illustrated by FIG. 5B and that column 2 of the CAM array 26 is defective and that replacement column R is enabled. Then, under these assumptions, an operation to write a new entry equal to {10010010} and a local mask equal to {1111100} into row 0 will preferably cause the CAM cells $CAM_{00}$–$CAM_{0R}$ in row 0 to be written as follows:

| ROW 0 ← 100100XX | |
|---|---|
| DATA $RAM_{00}$ ← 1 (B1 = 1, B1B = 0) | MASK $RAM_{00}$ ← 1 (B2 = 1, B2B = 0) |
| DATA $RAM_{01}$ ← 0 (B1 = 0, B1B = 1) | MASK $RAM_{01}$ ← 1 (B2 = 1, B2B = 0) |
| DATA $RAM_{02}$ ← 0 (B1 = 0, B1B = 1) | MASK $RAM_{02}$ ← 0 (B2 = 0, B2B = 1) |
| DATA $RAM_{03}$ ← 0 (B1 = 0, B1B = 1) | MASK $RAM_{03}$ ← 1 (B2 = 1, B2B = 0) |
| DATA $RAM_{04}$ ← 1 (B1 = 1, B1B = 0) | MASK $RAM_{04}$ ← 1 (B2 = 1, B2B = 0) |
| DATA $RAM_{05}$ ← 0 (B1 = 0, B1B = 1) | MASK $RAM_{05}$ ← 1 (B2 = 1, B2B = 0) |
| DATA $RAM_{06}$ ← 0 (B1 = 0, B1B = 1) | MASK $RAM_{06}$ ← 1 (B2 = 1, B2B = 0) |
| DATA $RAM_{07}$ ← 1 (B1 = 1, B1B = 0) | MASK $RAM_{07}$ ← 0 (B2 = 1, B2B = 1) |
| DATA $RAM_{08}$ ← 0 (B1 = 0, B1B = 1) | MASK $RAM_{08}$ ← 0 (B2 = 1, B2B = 1) |

As a second example, if column 2 of the CAM array 26 is disabled and the replacement column R is enabled, then an operation to write a new entry equal to {11110010} and a local mask equal to {11111000} into row 7 will preferably cause the CAM cells $CAM_{70}$–$CAM_{7R}$ in row 7 to be written as follows:

| ROW 7 ← 11110XXX | |
|---|---|
| DATA RAM$_{70}$ ← 1 | MASK RAM$_{70}$ ← 1 |
| DATA RAM$_{71}$ ← 1 | MASK RAM$_{71}$ ← 1 |
| DATA RAM$_{72}$ ← 0 | MASK RAM$_{72}$ ← 0 |
| DATA RAM$_{73}$ ← 1 | MASK RAM$_{73}$ ← 1 |
| DATA RAM$_{74}$ ← 1 | MASK RAM$_{74}$ ← 1 |
| DATA RAM$_{75}$ ← 0 | MASK RAM$_{75}$ ← 1 |
| DATA RAM$_{76}$ ← 0 | MASK RAM$_{76}$ ← 0 |
| DATA RAM$_{77}$ ← 1 | MASK RAM$_{77}$ ← 0 |
| DATA RAM$_{78}$ ← 0 | MASK RAM$_{78}$ ← 0 |

As a third example, if an operation to write an updated entry equal to {00000010} and a local mask equal to {11110000} into row 7 is performed after the write operation described by the second example has been performed, CAM cells CAM$_{70}$–CAM$_{7R}$ in row 7 may be written as follows:

| ROW 7 ← 0000XXXX | |
|---|---|
| DATA RAM$_{70}$ ← 0 | MASK RAM$_{70}$ ← 1 |
| DATA RAM$_{71}$ ← 0 | MASK RAM$_{71}$ ← 1 |
| DATA RAM$_{72}$ ← 0 | MASK RAM$_{72}$ ← 0 |
| DATA RAM$_{73}$ ← 0 | MASK RAM$_{73}$ ← 1 |
| DATA RAM$_{74}$ ← 0 | MASK RAM$_{74}$ ← 1 |
| DATA RAM$_{75}$ ← 0 | MASK RAM$_{75}$ ← 0 |
| DATA RAM$_{76}$ ← 0 | MASK RAM$_{76}$ ← 0 |
| DATA RAM$_{77}$ ← 1 | MASK RAM$_{77}$ ← 0 |
| DATA RAM$_{78}$ ← 0 | MASK RAM$_{78}$ ← 0 |

Alternatively, because the column disabled CAM cell in row 7 was correctly written to in example 2 (with DATA RAM$_{72}$←0 and MASK RAM$_{72}$←0), the bit lines B1, B1B, B2 and B2B within column 2 may all be driven to logic 1 values so that the disabled CAM cell in row 7 (i.e., CAM$_{72}$) undergoes a nondestructive read operation while the other CAM cells in row 7 undergo a write operation. This alternative, which requires additional circuitry to implement, is not preferred.

As described above, the complementary bit line in the leftmost pair (shown as B1B) and the true bit line in the rightmost pair (shown as B2) also operate as a pair of differential data lines (D, DB) if the CAM cells illustrated by FIG. 5B are used. Each pair of differential data lines D and DB receives a respective comparand bit of an applied search word (where (D=0 and DB=1) or (D=1 and DB=0)) or a global mask bit (D=DB=0), during a search operation. The column control circuit 22 of FIG. 5A may be fuse-programmed to drive the pair of differential data lines associated with each disabled column of the CAM array with only global mask bits during a search operation. In particular, the bit line drivers (e.g., CMOS drivers) associated with a defective column (or unused redundant column) may be configured to drive the respective pair of data lines D and DB to the following fixed states during search operations: D=DB=0 (when an input signal SEARCH to the column control circuit 22 is active). These same states may also apply during write and read operations. Such configuration may involve the blowing of one or more fuses in the column control circuit 22, in response to yield testing.

Figure 5C:
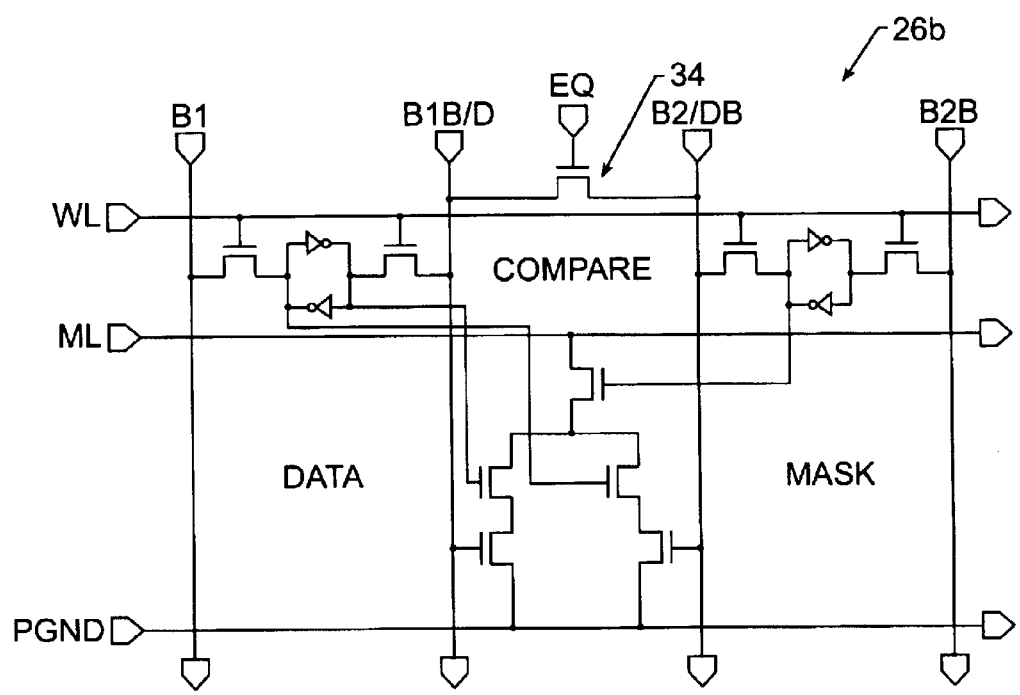
FIG. 5C is an electrical schematic of a preferred CAM cell used in the CAM array of FIG. 5B. An equalization transistor is also included to provide data line charge recycling.

Referring now to FIG. 5C, preferred operations to compare the contents of a preferred "lateral" CAM cell 26b to a corresponding bit of an applied search word (i.e., bit of a comparand) will be described. The lateral CAM cell 26b includes a data RAM cell and a mask RAM cell. Writing to the lateral CAM cell 26b includes driving a first pair of bit lines B1 and B1B with a rail-to-rail signal and also driving a second pair of bit lines B2 and B2B with a rail-to-rail signal. A rail-to-rail signal is typically Vdd-to-Vss (i.e., B1=Vdd, B1B=Vss or B1=Vss, B1B=Vdd). Four possible combinations of bit line signals are possible during a write operation when WL=1:

| CAM cell | Data RAM cell | Mask RAM cell | B1/B1B | B2/B2B |
|---|---|---|---|---|
| 0 | 0 | 1 | 0/1 | 1/0 |
| 1 | 1 | 1 | 1/0 | 1/0 |
| X | 0 | 0 | 0/1 | 0/1 |
| X | 1 | 0 | 1/0 | 0/1 |

During a search operation, the illustrated match line ML and pseudo-ground line PGND are both precharged high and the voltages on the bit/data lines B1B/D and B2/DB are at least substantially equilibrated to about ½Vdd (e.g., to within 30% of the rail-to-rail voltage across a pair of data lines (i.e., 0.3(Vdd−Vss))). This equilibration is achieved by driving a gate of an equalization transistor 34 with an active high signal (i.e., EQ=1). Driving the gate of the equalization transistor 34 with an active high signal will result in a charge transfer between B1B and B2. In this manner, a significant amount of the power supply charge originally required to pull the more positively biased one of B1B and B2 to a logic 1 value can be recycled. Devices and methods of conserving power by recycling charge supplied by a signal line driver to a load having capacitance, including bit line charge, are more fully described in the aforementioned '907 patent to Lien et al. Additional techniques are also described in U.S. Pat. No. 6,307,417, entitled "Integrated Circuit Output Buffers Having Reduced Power Consumption Requirements and Methods of Operating Same," and in U.S. application Ser. No. 10/004,456, filed Oct. 19, 2001, entitled "Complementary Data Line Driver Circuits Having Conditional Charge Recycling Capability and Methods of Operating Same," the disclosures of which are hereby incorporated herein by reference.

After the voltages on the bit/data lines B1B/D and B2/DB have been partially equilibrated or substantially equilibrated (e.g., to within about 0.3(Vdd−Vss)), a respective bit of a comparand (i.e., search word) is driven onto the bit/data lines B1B/D and B2/DB as a differential signal (e.g., D=1, DB=0 or D=0, DB=1). This driving of the bit/data lines B1B/D and B2/DB with a bit of a comparand is performed by the column control circuit 22. An operation to compare the value of the bit of the comparand driven onto the bit/data lines B1B/D and B2/DB with the value of the data stored within the lateral CAM cell 26b can then be initiated by pulling the pseudo-ground line PGND low from a precharge high level. In this manner, the compare circuit within the CAM cell 26b (shown as 5 transistors) can be enabled, and the match line ML can be pulled low from its precharged high level if a miss condition is present and the CAM cell 26b is not locally masked by its internal mask RAM cell (i.e., Mask RAM cell=1). In the event the bit/data lines B1B/D and B2/DB are both driven and held low during a search operation, the CAM cell 26b (and all other CAM cells in the same column) will be globally masked.

Figure 5D:
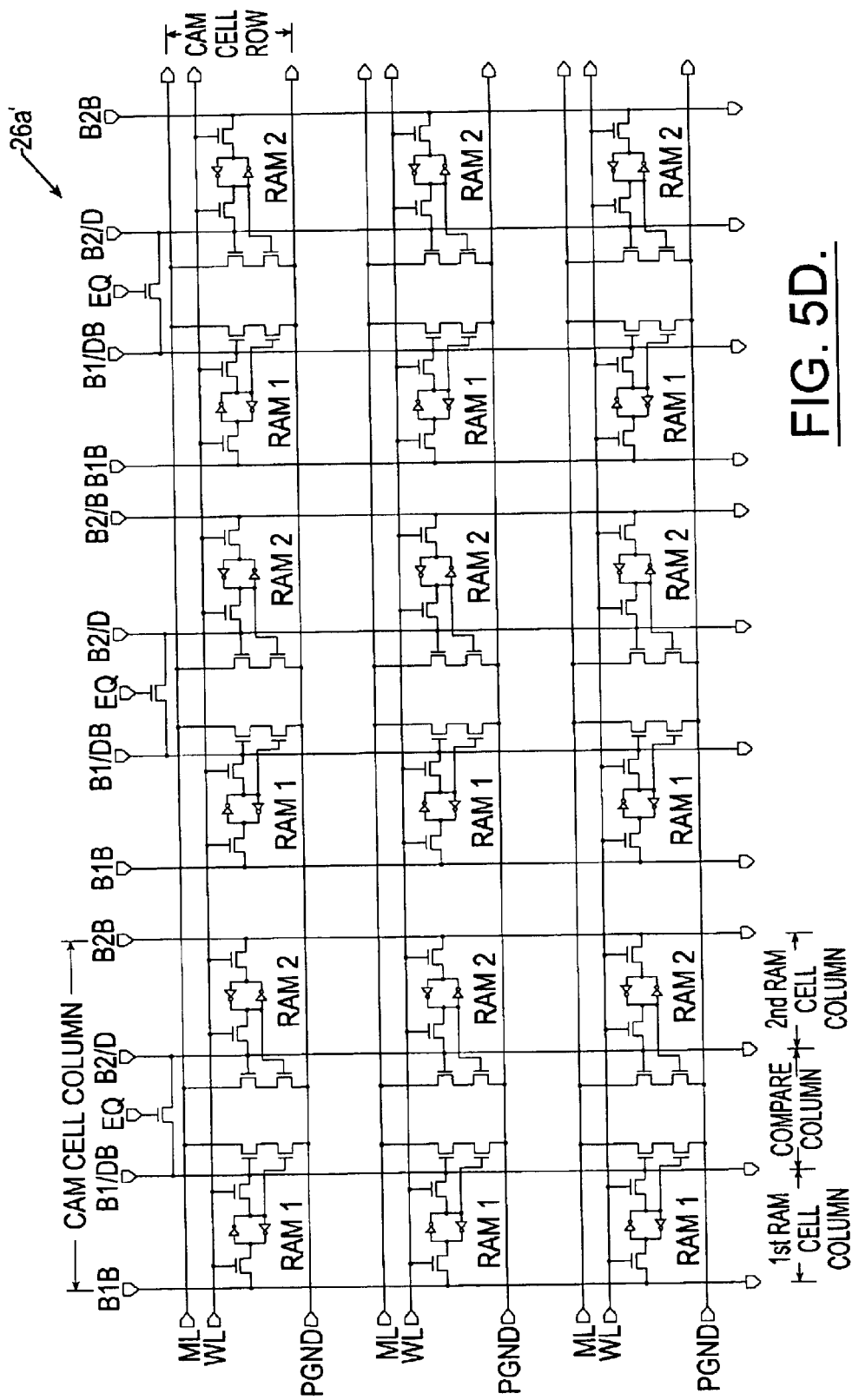
FIG. 5D is a detailed electrical schematic of another CAM array that may be used in the CAM device of FIG. 5A.
Figure 5E:
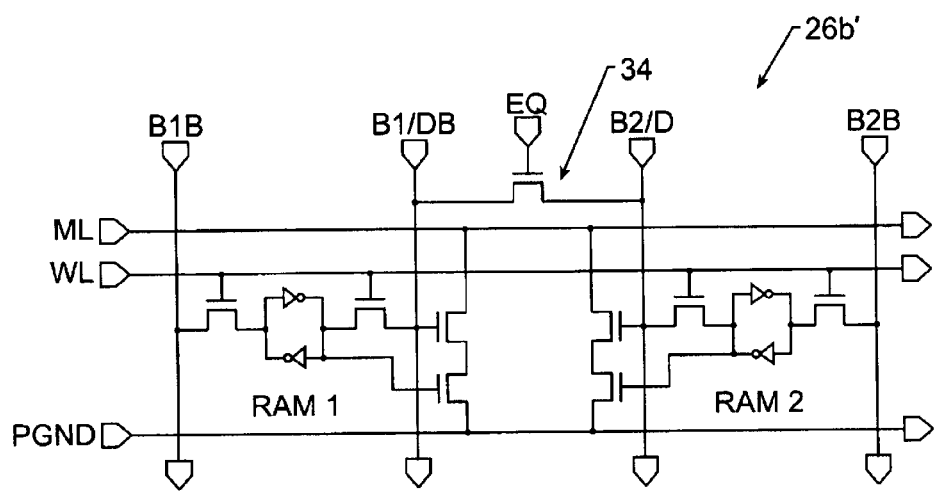
FIG. 5E is an electrical schematic of a preferred CAM cell used in the CAM array of FIG. 5D. An equalization transistor is also included to provide data line charge recycling.

Referring now to FIGS. 5D and 5E, a CAM array 26' according to another preferred embodiment includes lateral CAM cells 26b' that have one fewer transistor relative to the lateral CAM cell 26b of FIG. 5C. The lateral CAM cell 26b' includes a first data RAM cell (RAM 1) and a second data RAM cell (RAM 2). Writing to the lateral CAM cell 26b' of FIG. 5E includes driving a first pair of bit lines B1 and B1B with a rail-to-rail signal and also driving a second pair of bit lines B2 and B2B with a rail-to-rail signal. Four possible combinations of bit line signals are possible during a write operation when WL=1:

| CAM cell | RAM 1 cell | RAM 2 cell | B1/B1B | B2/B2B |
|---|---|---|---|---|
| 0 | 0 | 1 | 0/1 | 1/0 |
| N/A | 1 | 1 | 1/0 | 1/0 |
| X | 0 | 0 | 0/1 | 0/1 |
| 1 | 1 | 0 | 1/0 | 0/1 |

Figure 10:
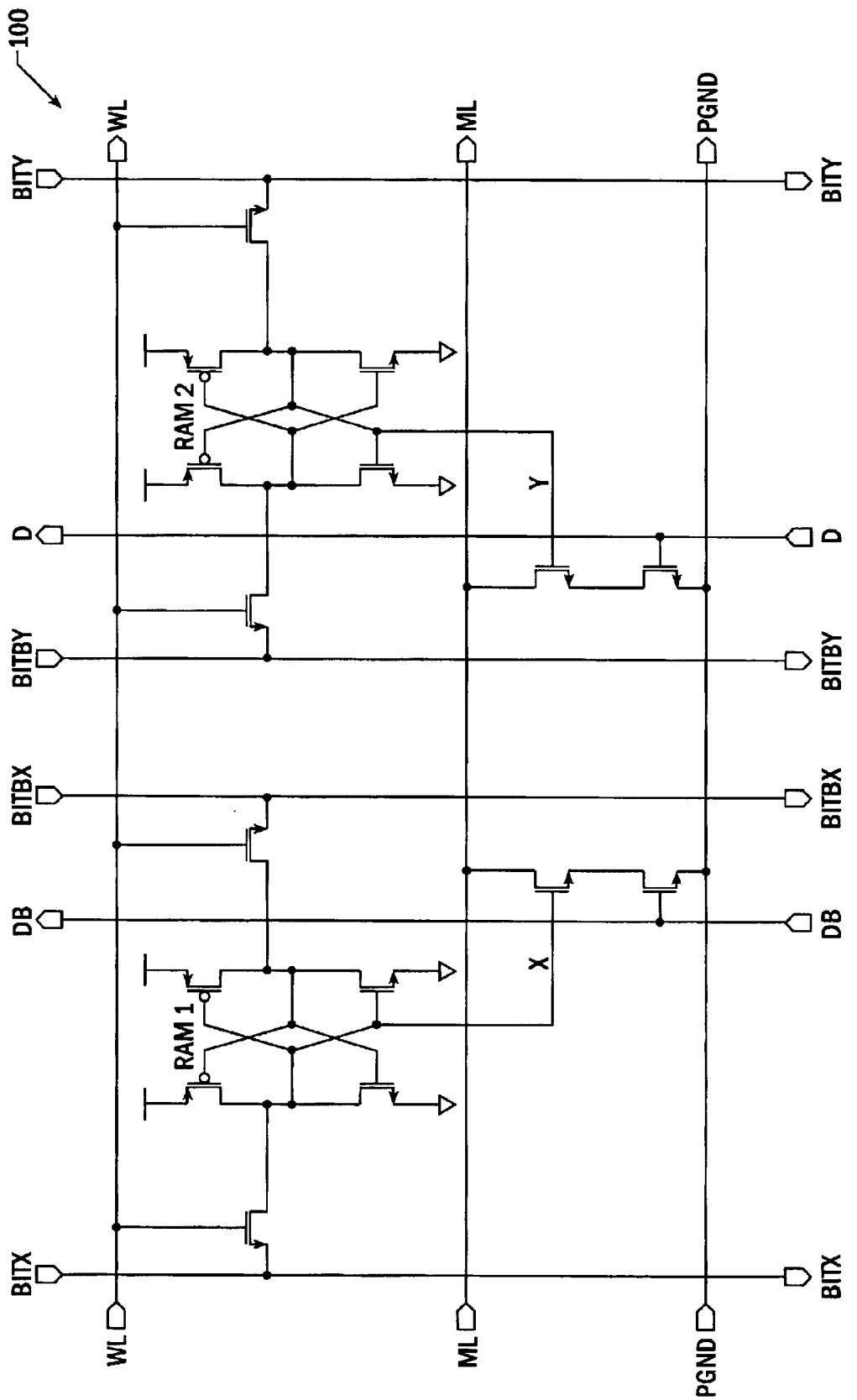
FIG. 10 is an electrical schematic of a lateral XY CAM cell according to an embodiment of the present invention.

During a search operation, the illustrated match line ML and pseudo-ground line PGND are both precharged high and the voltages on the bit/data lines B2/D and B1/DB are at least partially or substantially equilibrated by turning on an equalization transistor 34 and transferring charge (in the form of displacement current) from D to DB or vice versa. After the voltages on the bit/data lines B2/D and B1/DB have been equilibrated to at least some degree, a respective bit of a comparand (i.e., search word) is driven onto the bit/data lines B2/D and B1/DB as a differential signal (e.g., D=1, DB=0 or D=0, DB=1). This driving of the bit/data lines B2/D and B1/DB with a bit of a comparand is performed by the column control circuit 22. An operation to compare the value of the bit of the comparand driven onto the bit/data lines B2/D and B1/DB with the value of the data stored within the lateral CAM cell 26b' can then be initiated by pulling the pseudo-ground line PGND low from a precharge high level. In this manner, the compare circuit within the CAM cell 26b' (shown as 4 transistors) can be enabled, and the match line ML can be pulled low from its precharged high level if a miss condition is present. In the event the bit/data lines B2/D and B1/DB are both held low during a search operation, the CAM cell 26b' (and all other CAM cells in the same column) will be globally masked. FIG. 10 illustrates a lateral CAM cell 100 that is similar to the CAM cell 26b' of FIG. 5E, however six (6) vertical lines are provided instead of four (4). These vertical lines are illustrated as two pairs of bit lines (BITX, BITBX), (BITY, BITBY) and one pair of data lines (D, DB). To conserve power, the voltage swings on the data lines D and DB may be less than Vdd. For example, the voltage swings on the data lines D and DB may equal Vdd–Vth, where Vth is a threshold voltage of an NMOS transistor provided in the pull-up path of driver circuitry (not shown) associated with the data lines D and DB. The bit lines, which are accessed relatively infrequently because of a dominance of search operations relative to read or write operations, may swing full rail-to-rail from Vss-to-Vdd.

Figure 5F:
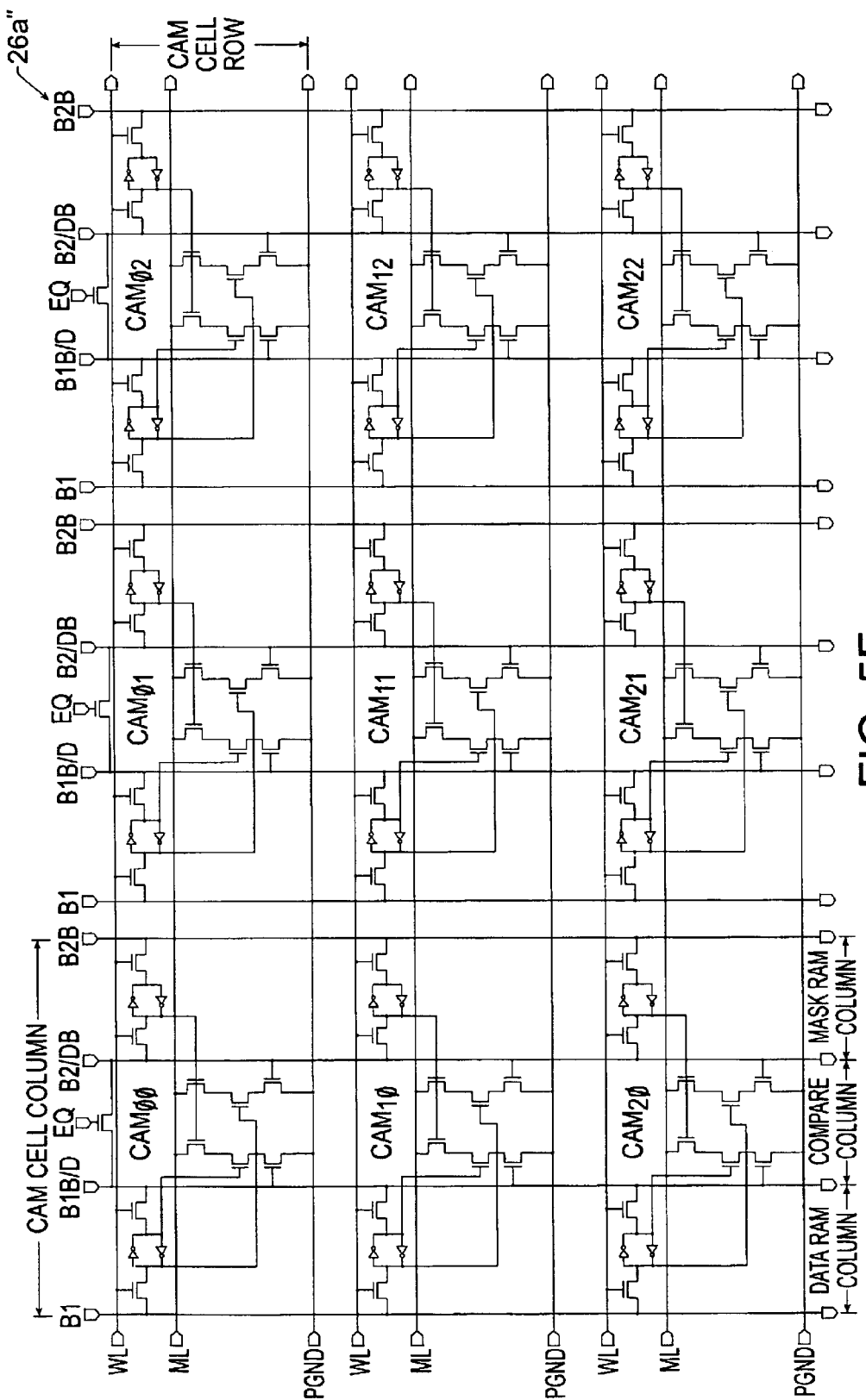
FIG. 5F is a detailed electrical schematic of another array of CAM cells that may be used in the CAM device of FIG. 5A.
Figure 5G:
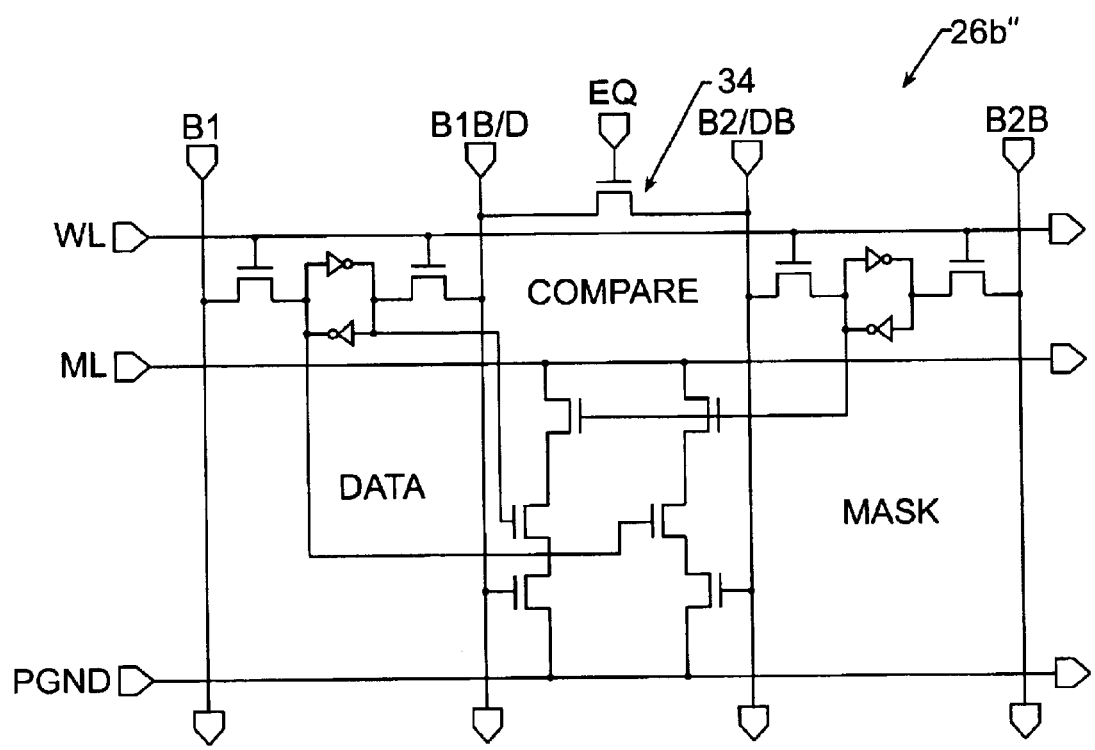
FIG. 5G is an electrical schematic of a CAM cell having a 6T compare circuit according to another embodiment of the present invention.

FIG. 5F illustrates a detailed electrical schematic of a CAM array 26a'' according to another embodiment of the present invention. Each lateral CAM cell 26b'' within this CAM array 26a'' is illustrated in detail by FIG. 5G. The CAM cell 26b'' of FIG. 5G is similar to the CAM cell 26b of FIG. 5C, however, the compare logic within the CAM cell 26b'' includes six transistors (6T) instead of the five transistors (5T) within the compare logic illustrated by FIG. 5C. According to a preferred aspect of this embodiment, the use of an additional transistor within the 6T compare circuit illustrated by FIG. 5G enhances the efficiency by which the compare logic may be laid out on an integrated circuit chip. In particular, the use of an additional transistor improves the symmetry of the compare circuitry and provides for more efficient placement of transistor regions and routing of vias and interconnect lines vis-a-vis the 5T compare circuit illustrated by FIG. 5C. The six transistors within the compare logic are arranged as two totem poles that extend between respective match and pseudo-ground lines, with each totem pole including three MOS transistors (shown as NMOS) connected in series (i.e., source-to-drain).

Figure 6:
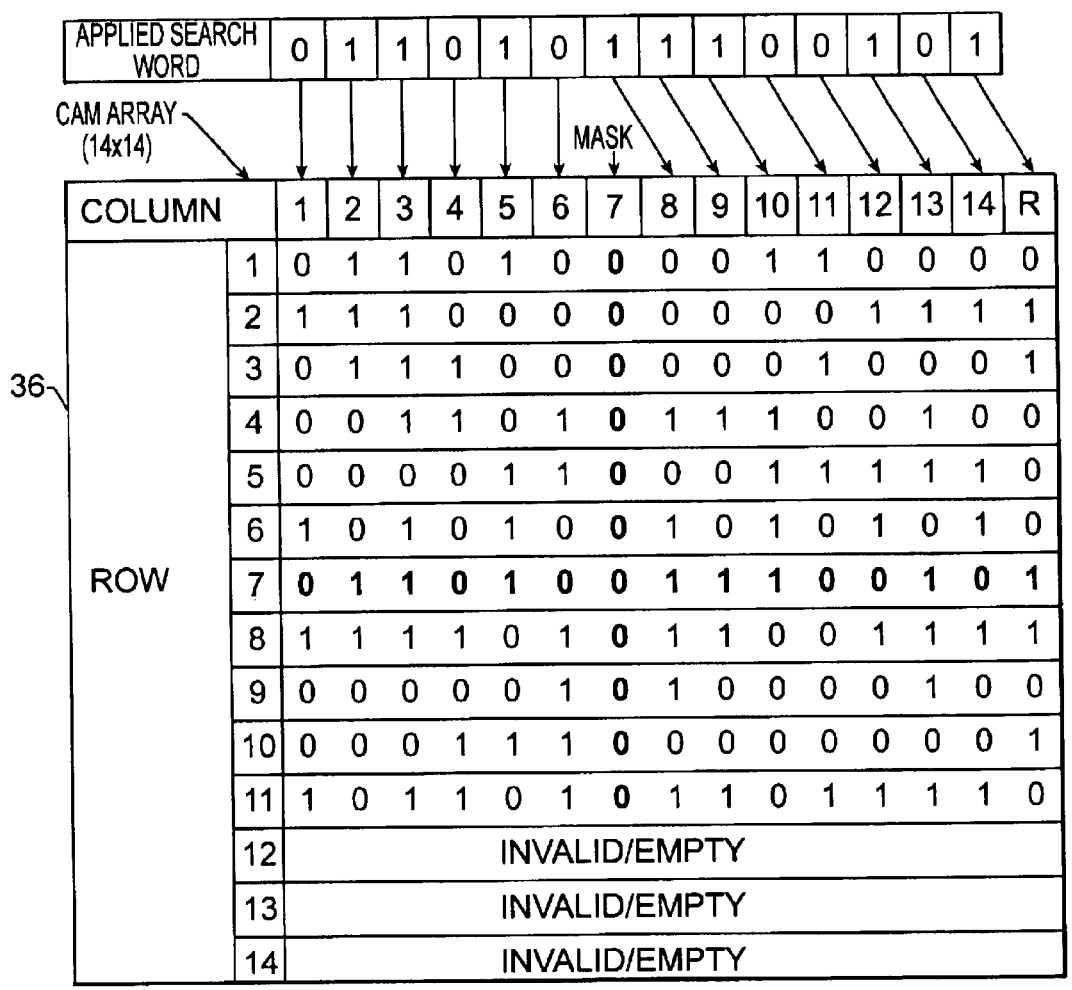
FIG. 6 is a block diagram of a partially full CAM array undergoing a search operation with an applied search word, according to another embodiment of the present invention.

The preferred operations described above will now be more fully illustrated by FIG. 6. In particular, FIG. 6 illustrates the state of a preferred 14×14 binary CAM array 36 undergoing a search operation. During the search operation, a disabled column, shown as column 7, is globally masked and row 7 is highlighted as a matching entry. The CAM cells in the disabled column are also loaded with a same data value (shown as 0). The column control circuitry is programmed to preserve the illustrated data values within the disabled CAM cells every time the CAM array 36 is reloaded with new entries. Such reloading operations may occur in response to a power reset event.

Figure 7A:
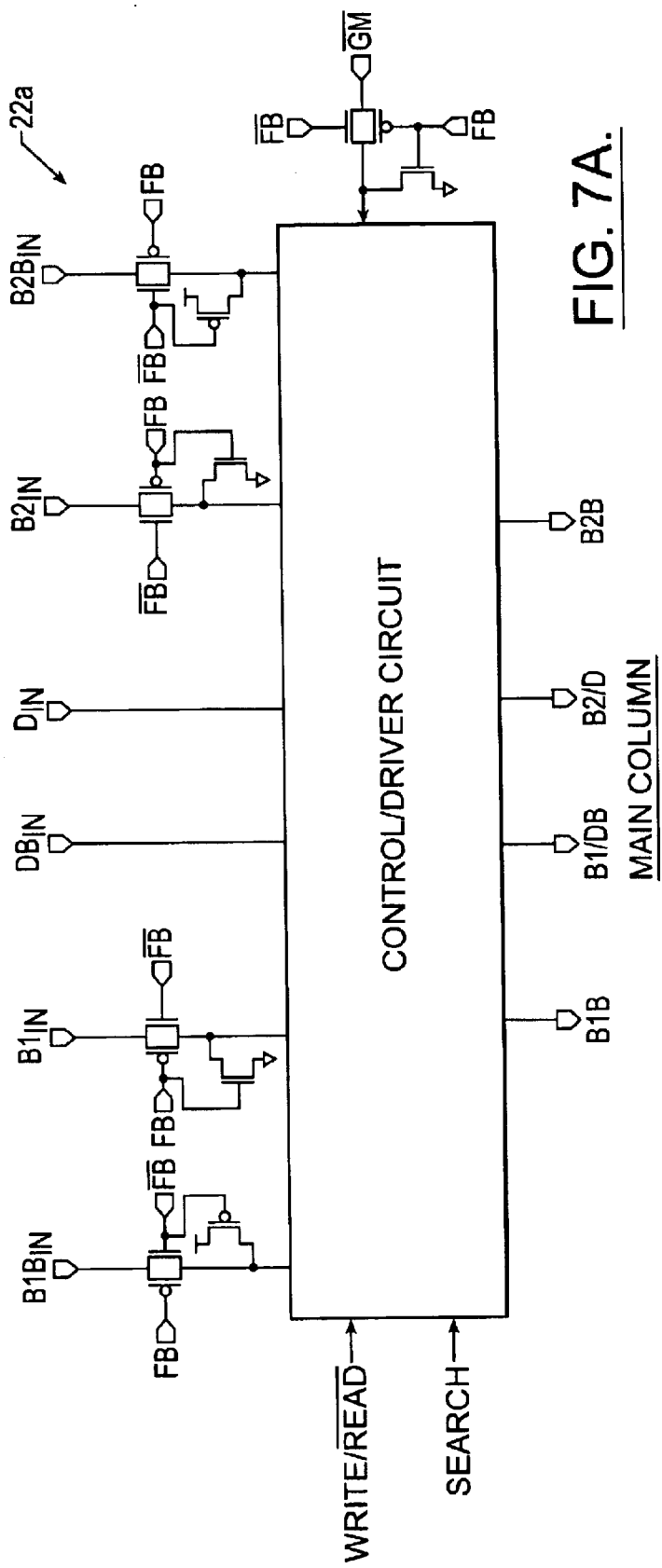
FIG. 7A is a main column control and driver circuit according to an embodiment of the present invention.
Figure 7B:
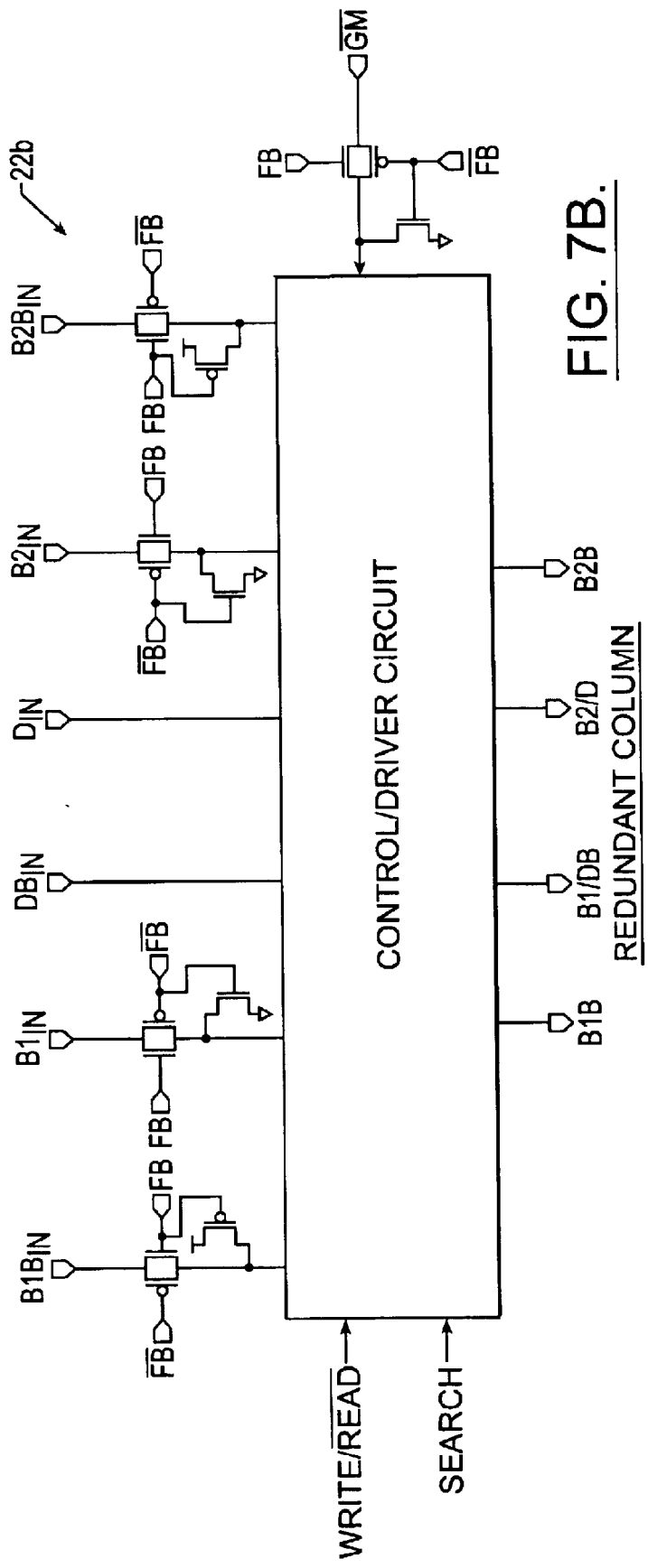
FIG. 7B is a redundant column control and driver circuit according to an embodiment of the present invention.

Referring now to FIGS. 7A–7B, preferred bit/data line control and driver circuits 22a and 22b will be described. In particular, FIG. 7A illustrates a main bit/data line control and driver circuit 22a and FIG. 7B illustrates a redundant bit/data line control and driver circuit 22b. These driver circuits 22a and 22b may be coupled to the CAM array 26a' of FIG. 5D. As illustrated by FIG. 7A, in a default condition when a respective fuse is present (i.e., FB=0), data provided on input bit and data lines (B1B$_{IN}$, B1$_{IN}$, DB$_{IN}$, D$_{IN}$, B2$_{IN}$, B2B$_{IN}$ is passed to the corresponding bit and data lines of a main column of a corresponding CAM array, as discussed above. However, if the fuse is cut, thereby rendering the main column disabled, then the inputs B1B$_{IN}$ and B2B$_{IN}$ are clamped high and B1$_{IN}$ and B2$^{IN}$ are clamped low by the illustrated pull-up and pull-down transistors. The output signal lines B1B, B1/D, B2/DB and B2B will be set accordingly to 1, 0, 0, 1, respectively, to match the clamped inputs for each valid combination of the illustrated control inputs WRITE (/READ) and SEARCH (i.e., WRITE=0, SEARCH=0 (READ), WRITE=1, SEARCH=0 (WRITE) and WRITE=0, SEARCH=1 (SEARCH)).

In contrast, with respect to the redundant bit/data line control and driver circuit 22b, the default condition is opposite to the default condition of the main bit/data line control and driver circuit 22a. In particular, if the fuse is not cut, then the redundant column remains disabled and the inputs B1B$_{IN}$, and B2B$_{IN}$ are clamped high and B1$_{IN}$ and B2$^{IN}$ are clamped low by the illustrated pull-up and pull-down transistors. The corresponding output signal lines B1B, B1/D, B2/DB and B2B will be set accordingly to 1, 0, 0, 1, respectively, to match the clamped inputs for each valid combination of the illustrated control inputs WRITE (/READ) and SEARCH (i.e., WRITE=0, SEARCH=0 (READ), WRITE=1, SEARCH=0 (WRITE) and WRITE=0, SEARCH=1 (SEARCH)). But, if the fuse is cut, data provided on input bit and data lines (B1B$_{IN}$, B1$_{IN}$, DB$_{IN}$, D$_{IN}$, B2$^{IN}$, B2B$_{IN}$) is passed to the corresponding bit and data lines of a redundant column of the CAM array.

Figure 8A:
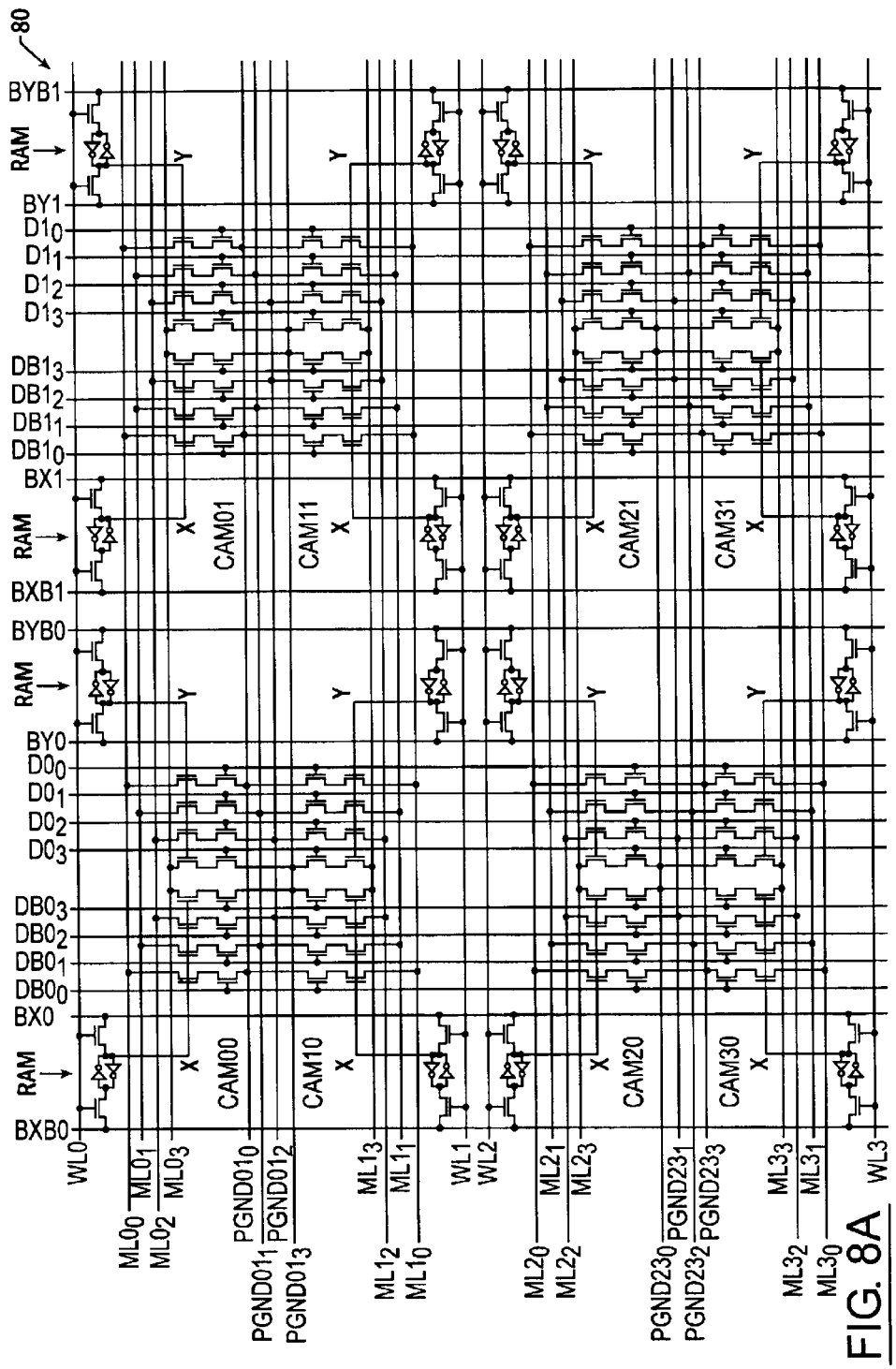
FIG. 8A is an electrical schematic of a 4×2 sub-array of multi-port lateral CAM cells according to an embodiment of the present invention.

Referring now to FIG. 8A, an array 80 of multi-port CAM cells according to an embodiment of the present invention will be described. As explained more fully hereinbelow, this array 80 may constitute the two leftmost columns of ternary multi-port CAM cells illustrated in FIG. 9B. Each of the illustrated multi-port CAM cells, CAM$_{00}$–CAM$_{30}$ in column 0 and CAM$_{01}$–CAM$_{31}$ in column 1, includes a pair of memory cells (shown as conventional SRAM cells) that are disposed laterally relative to each other and thereby share the same word line. For example, the two memory cells within CAM cell CAM$_{00}$ have access transistors that are responsive to word line signal WL0. Similarly, the two memory cells within CAM cell $CAM_{01}$ have access transistors that are responsive to the same word line signal WL0. The CAM cells $CAM_{10}$ and $CAM_{11}$ in row 1 of the array 80 are essentially mirror images of the CAM cells $CAM_{00}$ and $CAM_{01}$ in row 0. The CAM cells in rows 2 and 3 of the array 80 are also effectively mirror images of each other.

Figure 9B:
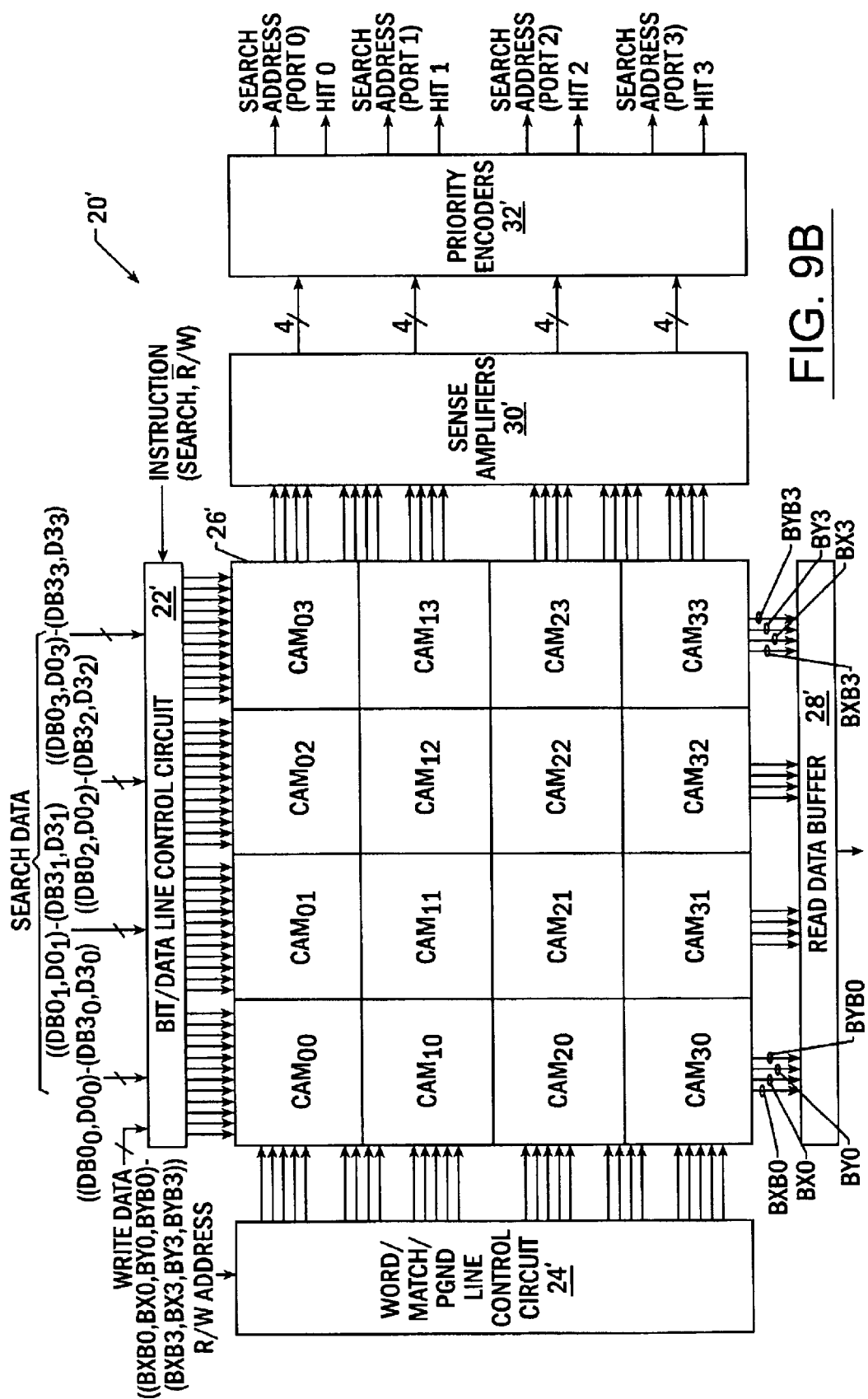
FIG. 9B is a block diagram of a multi-port CAM device according to an embodiment of the present invention.

The upper leftmost CAM cell $CAM_{00}$ is illustrated as including four (4) independent compare circuits, with each compare circuit having four transistors (4T) therein (see also, FIG. 5E). As illustrated by FIGS. 9A–9B, these four compare circuits are associated with four ports of a CAM device. The first compare circuit includes two left-side NMOS transistors that are electrically connected in series between match line segment $ML0_0$ and shared pseudo-ground line segment $PGND01_0$. The two left-side NMOS transistors have gate terminals that are responsive to an output (X) of the left-side memory cell and complementary data line $DB0_0$. The first compare circuit also includes two right-side NMOS transistors that are electrically connected in series between match line segment $ML0_0$ and shared pseudo-ground line segment $PGND01_0$. The two right-side NMOS transistors have gate terminals that are responsive to an output (Y) of the right-side memory cell and true data line $D0_0$. Based on this configuration of the first compare circuit, when the outputs X and Y of the left and right-side memory cells are set to (0,0), the CAM cell $CAM_{00}$ will be treated as actively masked. Alternatively, when the outputs X and Y of the left and right-side memory cells are set to (0,1) or (1,0), the CAM cell $CAM_{00}$ will be treated as storing a "0" or "1", respectively ((X,Y)=(1,1) is an invalid condition). Accordingly, the CAM cells in the array 80 are treated as ternary cells.

The second compare circuit in CAM cell $CAM_{00}$ includes two left-side NMOS transistors that are electrically connected in series between match line segment $ML0_1$ and shared pseudo-ground line segment $PGND01_1$. The two left-side NMOS transistors have gate terminals that are responsive to the output (X) of the left-side memory cell and complementary data line $DB0_1$. The second compare circuit also includes two right-side NMOS transistors that are electrically connected in series between match line segment $ML0_1$ and shared pseudo-ground line segment $PGND01_1$. The two right-side NMOS transistors have gate terminals that are responsive to the output (Y) of the right-side memory cell and true data line $D0_1$.

The third compare circuit in CAM cell $CAM_{00}$ includes two left-side NMOS transistors that are electrically connected in series between match line segment $ML0_2$ and shared pseudo-ground line segment $PGND01_2$. The two left-side NMOS transistors have gate terminals that are responsive to the output (X) of the left-side memory cell and complementary data line $DB0_2$. The third compare circuit also includes two right-side NMOS transistors that are electrically connected in series between match line segment $ML0_2$ and shared pseudo-ground line segment $PGND01_2$. The two right-side NMOS transistors have gate terminals that are responsive to the output (Y) of the right-side memory cell and true data line $D0_2$.

The fourth compare circuit in CAM cell $CAM_{00}$ includes two left-side NMOS transistors that are electrically connected in series between match line segment $ML0_3$ and shared pseudo-ground line segment $PGND01_3$. The two left-side NMOS transistors have gate terminals that are responsive to the output (X) of the left-side memory cell and complementary data line $DB0_3$. The fourth compare circuit also includes two right-side NMOS transistors that are electrically connected in series between match line segment $ML0_3$ and shared pseudo-ground line segment $PGND01_3$. The two right-side NMOS transistors have gate terminals that are responsive to the output (Y) of the right-side memory cell and true data line $D0_3$.

Figure 8B:
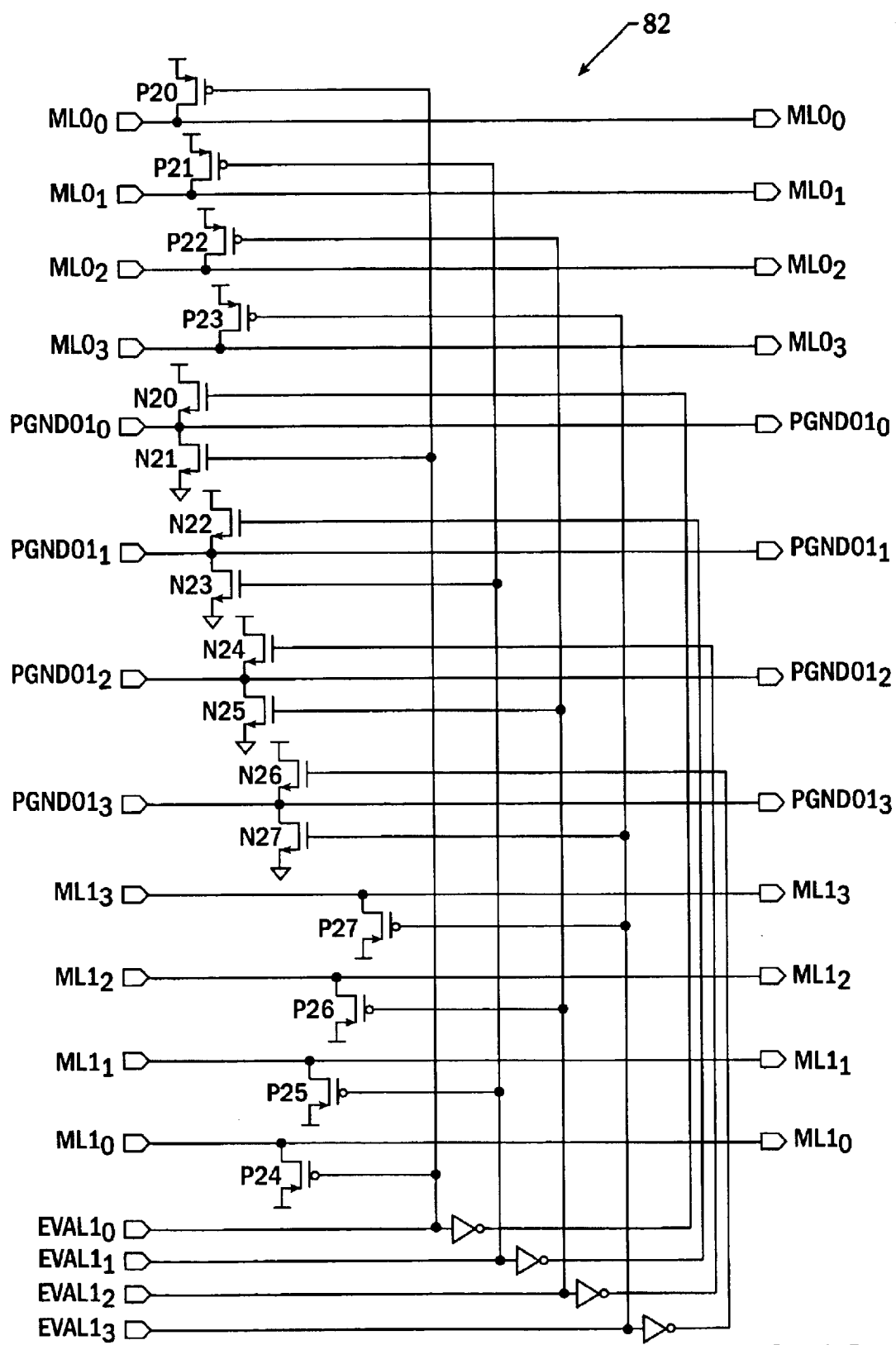
FIG. 8B is an electrical schematic of pull-up and pull-down transistors that can be used to precharge the match and pseudo-ground lines illustrated by FIG. 8A and commence respective search operations.

These first, second, third and fourth compare circuits are configured to operate independently of each other. In particular, the match line segments $ML0_0$–$ML0_3$ and shared pseudoground line segments and signals thereon are controlled (e.g., precharged, evaluated, captured) in-sync with separate clock signals during respective search operations. These separate clock signals may be asynchronous relative to each other, as explained more fully hereinbelow with respect to FIGS. 9A–9B. Accordingly, operations to precharge the illustrated match line and pseudo-ground line segments during precharge operations may be performed asynchronously relative to each other. Similarly, operations to commence respective search operations by switching the pseudo-round line segments high-to-low may also be performed asynchronously relative to each other. The asynchronous nature of these operations is more fully illustrated by the precharge and pull-own control circuit 82 illustrated by FIG. 8B. In FIG. 8B, PMOS pull-up transistors P20 and P24 operate to precharge match line segments $ML0_0$ and $ML1_0$ to a voltage level of Vdd, in response to a high-to-low transition of an evaluation control signal $EVAL1_0$ associated with Port 0 of a multi-port CAM device. NMOS transistor N20 operates to precharge shared pseudo-ground line segment $PGND01_0$ to a maximum voltage of Vdd–Vth, in response to the high-to-low transition of the evaluation control signal $EVAL1_0$. The voltage Vth represents the threshold voltage of NMOS transistor N20. A search operation associated with Port 0 may be commenced in-sync with a leading low-to-high transition of the evaluation control signal $EVAL1_0$, which operates to turn on NMOS pull-down transistor N21 and thereby pull-down shared pseudo-ground line segment $PGND01_0$.

PMOS pull-up transistors P21 and P25 operate to precharge match line segments $ML0_1$ and $ML1_1$ to a voltage level of Vdd, in response to a high-to-low transition of an evaluation control signal $EVAL_1$ associated with Port 1 of the multi-port CAM device. NMOS transistor N22 also operates to precharge shared pseudo-ground line segment $PGND01_1$ in response to the high-to-low transition of the evaluation control signal $EVAL1_1$. A search operation associated with Port 1 may be commenced in-sync with a leading low-to-high transition of the evaluation control signal $EVAL1_1$, which operates to turn on NMOS pull-down transistor N23 and thereby pull-down shared pseudo-ground line $PGND01_1$.

PMOS pull-up transistors P22 and P26 operate to precharge match line segments $ML0_2$ and $ML1_2$ to a voltage level of Vdd, in response to a high-to-low transition of an evaluation control signal $EVAL1_2$ associated with Port 2 of the multi-port CAM device. NMOS transistor N24 also operates to precharge shared pseudo-ground line segment $PGND01_2$ in response to the high-to-low transition of the evaluation control signal $EVAL1_2$. A search operation associated with Port 2 may be commenced in-sync with a leading low-to-high transition of the evaluation control signal $EVAL1_2$, which operates to turn on NMOS pull-down transistor N25 and thereby pull-down shared pseudo-ground line $PGND01_2$.

PMOS pull-up transistors P23 and P27 operate to precharge match line segments $ML0_3$ and $ML1_3$ to a voltage level of Vdd, in response to a high-to-low transition of an evaluation control signal $EVAL1_3$ associated with Port 3 of the multi-port CAM device. NMOS transistor N26 also operates to precharge shared pseudo-ground line segment $PGND01_3$ in response to the high-to-low transition of the evaluation control signal $EVAL1_3$. A search operation associated with Port 3 may be commenced in-sync with a leading low-to-high transition of the evaluation control signal $EVAL1_3$, which operates to turn on NMOS pull-down transistor N27 and thereby pull-down shared pseudo-ground line $PGND01_3$.

Operations to control the match line segments and pseudo-ground line segments during pipelined search operations are more fully described in U.S. Provisional Application Serial No. 60/371,491, filed Apr. 10, 2002, assigned to the present assignee, the disclosure of which is hereby incorporated herein by reference.

Like CAM cell $CAM_{00}$, each of the other CAM cells in the array 80 includes four compare circuits that are electrically coupled to corresponding match line and pseudo-ground line segments, as illustrated. The independent operation of the multiple 4T compare circuits result in the CAM cell having multiple independently accessible "compare" ports. However, these CAM cells $CAM_{00}$–$CAM_{33}$ are not illustrated as having multiple write/read ports. Instead, a single write/read port is provided to each CAM cell by a single pair of access transistors. In some applications, additional write/read ports may be added to the CAM cells.

The multi-compare port CAM cells in the array 80 may also be configured as binary or quartnary cells that have a lateral or vertical layout of data and mask RAM cells therein. In addition, alternative compare logic that performs an XNOR or related function may be provided in place of the illustrated 4T compare logic. This alternative compare logic may or may not use pseudo-ground line signals in alternatively embodiments. Exemplary compare logic that may be utilized in a multi-port CAM cell is illustrated by U.S. Pat. Nos. 6,128,207, 6,256,216, 6,262,907 and 6,266,263 to Lien et al., assigned to the present assignee, the disclosures of which are hereby incorporated herein by reference. Alternative compare logic based on conventional circuitry may also be used in less preferred embodiments.

Referring now to FIGS. 9A–9B, an integrated circuit system 90 that includes a multi-port CAM device 20' according to an embodiment of the present invention will be described. As illustrated, the system 90 includes a plurality of data processing units, shown as four independent controllers (0–3), which are electrically coupled to a respective port of an integrated circuit chip 92 having a CAM device 20' therein. In the illustrated embodiment, each of the controllers communicates independently with the chip 92, using a plurality of communication paths (e.g., buses and signal lines). These communication paths are shown as: Instruction, R/W Address, R/W Data, Search Data, CLKn, (where n=0, 1, 2 or 3), and Search Address. The "external" clock signals CLK0–CLK3 may be independently generated by the respective controllers and may have different frequencies. In alternative embodiments, one or more of the external clock signals may be synchronized with each other. Other communication paths (not shown) may also be provided and many of the illustrated paths may be combined and controlled in a shared and/or bidirectional manner using conventional techniques. For example, the read/write data and search data paths may share many of the same signal lines. In some additional embodiments of the present invention, each of the illustrated data processing units may also be replaced with a plurality of processing units and arbitration circuitry may be provided for controlling access to each of the ports of the chip 92. The illustrated clock signals may also control one or more aspects of the timing of the signals associated with respective ones of the communication paths using conventional bus timing techniques.

The multi-port CAM device 20' is configured to support independent and overlapping search operations that may be asynchronously timed relative to each other. Each of these search operations may be pipelined as described more fully in the aforementioned '491 application. In contrast, the read and/or write operations are preferably handled through a single read/write port of the CAM device 20', however, in other embodiments, multiple write ports may be provided. Thus, notwithstanding the independent and overlapping nature of the read/write instructions that may be issued by the controllers, access to the CAM device 20' is controlled to support one-at-a-time read or write access. The read or write operations are typically performed when the CAM device 20' is not undergoing a search operation, which is typically treated as having higher priority. This one-at-a-time read or write access is controlled by R/W control logic 44. This control logic 44 may be configured to support write and read accesses to the CAM device 20' that are synchronized with a read/write clock signal (not shown). This read/write clock signal may be generated asynchronously relative to the clock signals CLK0–CLK3 or may be generated synchronously with the clock signal CLK0–CLK3 having a highest frequency. The R/W control logic 44 may also utilize a read/write data and address queue(s) 42 with flexible priority support to arrange the sequencing of the read and write accesses to the CAM device 20'. The flexible priority support, which may be programmable, enables a write or read instruction associated with a particular controller to obtain a higher or lower priority relative to one or more previously issued read or write instructions that are held by the queue 42. This flexible priority support can be controller specific, with no controller being able to impact the priority of a read/write instruction issued by another controller, or global to all controllers with each controller having a relative priority. In the absence of flexible priority support, the read/write instructions may be handled strictly in the order in which they are received and the queue 42 may include a FIFO memory device for holding data and/or addresses pending an available time slot.

Referring now to FIG. 9B, a multi-compare port CAM device 20' according to an embodiment of the present invention will be described. The CAM device 20' includes a 4×4 CAM array 26', with each CAM cell having four compare ports. These CAM cells are more fully illustrated by FIG. 8A. A word line, match line and pseudo-ground line control circuit 24' is provided for driving the word lines of the array 26' during read and write operations. The row designated during read and write operations is specified by a R/W address. With respect to rows 0 and 1 of the CAM array 26', the control circuit 24' generates 14 horizontal signals. The five signals associated with row 0 correspond to WL0 and $ML0_0$–$ML0_3$ and the five signals associated with row 1 correspond to WL1 and $ML1_0$–$ML1_3$. Four pseudo-ground line signals $PGND01_0$–$PGND01_3$ are also shared by rows 0 and 1. As illustrated, similar word line, match line and pseudo-ground line signals are generated with respect to rows 2 and 3.

A bit/data line control circuit 22' is provided for driving the vertical bit and data lines that span the CAM array 26'. These lines are more fully illustrated by the array 80 of FIG. 8A. In particular, the write data is provided on the bit lines (BXB0,BX0,BY0,BYB0)–(BXB3,BX3,BY3,BYB3) associated with the four columns of CAM cells. During read operations, these vertical bit lines are used to pass stored data from the memory cells within a row of accessed CAM cells to a read data buffer 28'. Search data provided by one or more of the controllers illustrated by FIG. 9A is provided on the illustrated data lines. An array of sense amplifiers 30' may be provided for capturing match line signals generated by the CAM array 26' during search operations. Exemplary sense amplifiers are illustrated at FIG. 3D of the aforementioned '491 application. Priority encoders 32' are also provided for encoding active match line signals generated by the sense amplifiers 30' into search addresses and hit signals for Ports 0–3 using conventional encoding techniques.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A multi-port content addressable memory (CAM) device, comprising:
   a CAM array that is arranged as a plurality of rows and columns of multi-compare port CAM cells and is configured to enable comparison between at least first and second search word segments applied concurrently to the same multi-compare port CAM cells and data entries stored in the plurality of rows; and
   a control circuit that is configured to provide said CAM array with search control signals that enable the plurality of rows to be searched with the first and second search word segments during overlapping search cycles that are synchronized to separate clock signals, which are asynchronous relative to each other;
   wherein the plurality of rows of multi-compare port CAM cells include first and second rows of multi-compare port CAM cells that share at least first and second independently controllable pseudo-ground lines; and
   wherein the overlapping search cycles include a first search cycle that is commenced in-sync with a high-to-low transition of the first pseudo-ground line and a second search cycle that is commenced in-sync with a high-to-low transition of the second pseudo-ground line.

2. A multi-port content addressable memory (CAM) device, comprising:
   a CAM array that is arranged as a plurality of columns of multi-port CAM cells and a plurality of rows of multi-compare port CAM cells that are each electrically coupled to at least two pseudo-ground lines that are asynchronously timed relative to each other, said CAM array configured to enable overlapping comparison between at least first and second search word segments applied concurrently to the same multi-compare port CAM cells and data entries stored in the plurality of rows; and
   a control circuit that is configured to provide said CAM array with search control signals that enable the plurality of rows to be searched with the first and second search word segments during overlapping search cycles that are each commenced in-sync with a high-to-low transition of a respective one of the at least two pseudo-ground lines.

3. The CAM device of claim 1, wherein said control circuit is configured to switch a first plurality of pseudo-ground lines in said CAM array in-sync with a first clock signal and is further configured to switch a second plurality of the pseudo-ground lines in said CAM array in-sync with a second clock signal that is asynchronously generated relative to the first clock signal.

4. The CAM device of claim 3, wherein the first clock signal is synchronized with a one clock signal generated external to the CAM device and the second clock signal is synchronized with another clock signal generated external to the CAM device.

5. A content addressable memory (CAM) device, comprising:
   a CAM array having a plurality of columns of multi-compare port CAM cells therein; and
   a control circuit that is configured to provide said CAM array with search control signals that enable the multi-compare port CAM cells to be concurrently searched with at least first and second search words during at least first and second overlapping search cycles that are commenced in-sync with first and second external clock signals, respectively, which are asynchronous relative to each other.

6. The CAM device of claim 5, wherein the :plurality of rows of multi-compare port CAM cells include:
   a first row of multi-compare port CAM cells that is electrically coupled to first and second pseudo-ground lines; and
   a second row of multi-compare port CAM cells that is electrically coupled to the first and second pseudo-ground lines.

7. The CAM device of claim 6, wherein the overlapping search cycles include a first search cycle that is commenced in-sync with a high-to-low transition of the first pseudo-ground line and a second search cycle that is commenced in-sync with a high-to-low transition of the second pseudo-ground line.

8. A content addressable memory (CAM) device, comprising:
   a CAM array having at least first and second rows of multi-compare port CAM cells therein that share at least first and second independently controllable pseudo-ground lines; and
   a control circuit that is configured to provide said CAM array with search control signals that enable the multi-compare port CAM cells in the first and second rows to be concurrently searched with different search words during first and second overlapping search cycles that are in-sync with first and second clock signals, which are asynchronous relative to each other.

9. The CAM device of claim 8, further comprising:
   a first PMOS pull-up transistor that is electrically coupled to a first match line associated with the first row of multi-compare port CAM cells and has a gate that is responsive to a first evaluation signal; and
   a first NMOS pull-up transistor that is electrically coupled to the first pseudo-ground line and has a gate that is responsive to a complementary version of the first evaluation signal.

10. The CAM device of claim 9, further comprising:
   a second PMOS pull-up transistor that is electrically coupled to a first match line associated with the second row of multi-compare port CAM cells and has a gate that is responsive to the first evaluation signal.

11. A content addressable memory (CAM) array, comprising:
   a multi-compare port CAM cell that is electrically coupled to first and second match lines;
   a first PMOS pull-up transistor having a first current carrying terminal electrically connected to the first match line, a second current carrying terminal electrically connected to a power supply line and a gate that is responsive to a first evaluation signal having an inactive low state that enables precharge of the first match line by said first PMOS pull-up transistor;

a second PMOS pull-up transistor having a first current carrying terminal electrically connected to the second match line, a second current carrying terminal electrically connected to the power supply line and a gate that is responsive to a second evaluation signal having an inactive low state that enables precharge of the second match line by said second PMOS pull-up transistor; and a control circuit that generates the first and second evaluation signals in-sync with first and second clock signals, respectively, that are asynchronous relative to each other.

12. The CAM array of claim 11, further comprising:

first and second pseudo-ground lines electrically connected to said multi-compare port CAM cell;

a first NMOS pull-up transistor having a first current carrying terminal electrically connected to the first pseudo-ground line, a second current carrying terminal electrically connected to the power supply line and a gate that is responsive to a complementary version of the first evaluation signal; and a second NMOS pull-up transistor having a first current carrying terminal electrically connected to the second pseudo-ground line, a second current carrying terminal electrically connected to the power supply line and a gate that is responsive to a complementary version of the second evaluation signal.

13. The CAM array of claim 12, further comprising:

a first NMOS pull-down transistor having a first current carrying terminal electrically connected to the first pseudo-ground line, a second current carrying terminal electrically connected to a reference supply line and a gate that is responsive to the first evaluation signal; and a second NMOS pull-down transistor having a first current carrying terminal electrically connected to the second pseudo-ground line, a second current carrying terminal electrically connected to the reference supply line and a gate that is responsive to the second evaluation signal.

14. A content addressable memory (CAM) array, comprising:

a first row of multi-compare port CAM cells having at least a first lateral multi-compare port CAM cell therein, said first lateral multi-compare port CAM cell comprising:

first and second RAM cells;

a first compare circuit that is disposed between said first and second RAM cells and is electrically coupled to: a first pair of differential data lines, first and second outputs of said first and second RAM cells, a first match line and a first pseudo-ground line; and a second compare circuit that disposed between said first and second RAM cells and is electrically coupled to: a second pair of differential data lines, the first and second outputs of said first and second RAM cells, a second match line and a second pseudo-ground line; and a second row of multi-compare port CAM cells having at least a second lateral multi-compare port CAM cell therein, said second lateral multi-compare port CAM cell comprising:

third and fourth RAM cells;

a third compare circuit that is disposed between said third and fourth RAM cells and is electrically coupled to: the first pair of differential data lines, first and second outputs of said third and fourth RAM cells, a third match line and the first pseudo-ground line; and a fourth compare circuit that disposed between said third and fourth RAM cells and is electrically coupled to: the second pair of differential data lines, the first and second outputs of said third and fourth RAM cells, a fourth match line and the second pseudo-ground line.

15. The CAM array of claim 14, wherein said first RAM cell comprises at least one pair of access transistors that are electrically coupled to a first pair of bit lines; and wherein said third RAM cell comprises at least one pair of access transistors that are electrically coupled to the first pair of bit lines.

16. The CAM array of claim 14, wherein said first RAM cell comprises at least one pair of access transistors that are electrically coupled to a first word line; and wherein said second RAM cell comprises at least one pair of access transistors that are electrically coupled to the first word line.

17. An integrated circuit system, comprising:

a first data processing unit that generates a first clock signal;

a second data processing unit that generates a second clock signal, which is asynchronous relative to the first clock signal; and a CAM chip comprising:

a first data port that is configured to receive first search words from said first data processing unit, in-sync with the first clock signal;

a second data port that is configured to receive second search words from said second data processing unit, in-sync with the second clock signal; and a multi-compare port CAM array that is configured to support overlapping first and second search cycles that are synchronized with the first and second clock signals, respectively.

18. The system of claim 17, wherein said CAM chip further comprises at least one address queue that is configured to retain write addresses received from said first and second data processing units.

19. The system of claim 18, wherein the address queue is a first-in-first-out (FIFO) memory device.

20. The system of claim 17, wherein said CAM chip further comprises read/write control logic that is configured to support write operations that are synchronized with a higher frequency one of the first and second clock signals.

21. The system of claim 17, wherein said CAM chip further comprises read/write control logic that is configured to support write operations that are synchronized with a clock signal generated internal to said CAM chip.

22. The system of claim 18, wherein the at least one address queue has flexible priority support that enables entries therein to be taken out-of-turn.

23. A content addressable memory (CAM) device, comprising:

a CAM array having a plurality of columns of multi-compare port CAM cells therein; and a control circuit that is configured to provide said CAM array with search control signals that enable the multi-compare port CAM cells to be concurrently searched with at least first and second search words during at least first and second overlapping search cycles that are commenced in-sync with first and second external clock signals, respectively, having different frequencies.

24. A multi-port content addressable memory (CAM) device, comprising:
- a CAM array that is arranged as a plurality of rows and columns of multi-compare port CAM cells and is configured to enable comparison between at least first and second search word segments applied concurrently to the same multi-compare port CAM cells and data entries stored in the plurality of rows; and
- a control circuit that is configured to provide said CAM array with search control signals that enable the plurality of rows to be searched with the first and second search word segments during overlapping search cycles that are synchronized to separate clock signals, which are asynchronous relative to each other.

25. (Original) An integrated circuit system, comprising:
- a first data processing unit that generates a first clock signal;
- a second data processing unit that generates a second clock signal; and
- a CAM chip comprising:
  - a first data port that is configured to receive first search words from said first data processing unit, in-sync with the first clock signal, which is generated external to said CAM chip;
  - a second data port that is configured to receive second search words from said second data processing unit, in-sync with the second clock signal, which is generated external to said CAM chip; and
  - a multi-compare port CAM array that is configured to support overlapping first and second search cycles that are synchronized with the first and second clock signals, respectively.

26. The system of claim 25, wherein said CAM chip further comprises at least one address queue that is configured to retain write addresses received from said first and second data processing units.

27. The system of claim 26, wherein the address queue is a first-in-(FIFO) memory device.

28. The system of claim 25, wherein said CAM chip further comprises read/write control logic that is configured to support write operations that are synchronized with a higher frequency one of the first and second clock signals.

29. The system of claim 26, wherein the at least one address queue has flexible priority support that enables entries therein to be taken out-of-turn.

30. An integrated circuit chip, comprising:
- a CAM array having a first compare port that is configured to receive first search comparands during first search cycles and a second compare port that is configured to receive second search comparands during second search cycles that are asynchronously timed relative to the first search cycles, said CAM array having at least a first row of multi-compare-port CAM cells that is electrically connected to first and second match lines; and
- a control circuit that is configured to precharge the first match line in response to high-to-low transitions of a first evaluation control signal that are synchronized with the first search cycles and is further configured to precharge the second match line in response to high-to-low transitions of a second evaluation control signal that are synchronized with the second search cycles.

31. The integrated circuit chip of claim 30, wherein the first row of multi-compare-port CAM cells is electrically connected to first and second pseudo-ground lines; wherein said control circuit is configured to precharge the first pseudoground line in response to high-to-low transitions of the first evaluation control signal and discharge the first pseudo-ground line in response to low-to-high transitions of the first evaluation control signal; and wherein said control circuit is configured to precharge the second pseudo-ground line in response to high-to-low transitions of the second evaluation control signal and discharge the second pseudo-ground line in response to low-to-high transitions of the second evaluation control signal.

32. The integrated circuit chip of claim 30, wherein the first search cycles are synchronized to a first external clock signal received by the chip; wherein the second search cycles are synchronized to a second external clock signal received by the chip; and wherein the first and second external clock signals have different frequencies.

* * * * *

UNITED STATES PATENT AND TRADEMARK OFFICE
CERTIFICATE OF CORRECTION

PATENT NO. : 6,781,857 B1
APPLICATION NO. : 10/306799
DATED : August 24, 2004
INVENTOR(S) : Lien et al.

It is certified that error appears in the above-identified patent and that said Letters Patent is hereby corrected as shown below:

Column 23, line 63, change "The CAM device of claim 1" to -- The CAM device of claim 2 --.
Column 27, line 42, change "a first-in-(FIFO)" to -- a first-in-first-out (FIFO) --.
Column 28, line 28, change "pseudoground line" to -- pseudo-ground line --.

Signed and Sealed this

Twenty-fourth Day of October, 2006

JON W. DUDAS
*Director of the United States Patent and Trademark Office*